United States Patent
Kamiya et al.

(10) Patent No.: US 6,304,998 B1
(45) Date of Patent: Oct. 16, 2001

(54) METHOD OF MANUFACTURING INTEGRATED CIRCUIT DEVICE

(75) Inventors: Yasuo Kamiya; Satoru Yoshikawa, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/040,321

(22) Filed: Mar. 18, 1998

(30) Foreign Application Priority Data

Mar. 27, 1997 (JP) .................................................... 9/076018
Apr. 9, 1997 (JP) .................................................... 9-089840

(51) Int. Cl.⁷ .................................................... G06F 17/50
(52) U.S. Cl. .................... 716/4; 716/2; 716/3; 716/5; 716/6
(58) Field of Search ............................ 395/500.4, 500.23, 395/500.07; 716/6, 22, 3

(56) References Cited

U.S. PATENT DOCUMENTS

| | | | |
|---|---|---|---|
| 5,274,568 | * 12/1993 | Blinne et al. | 364/489 |
| 5,359,535 | * 10/1994 | Djaja et al. | 364/489 |
| 5,394,346 | * 2/1995 | Milsom | 364/578 |
| 5,452,225 | * 9/1995 | Hammer | 364/488 |
| 5,475,607 | * 12/1995 | Apte et al. | 364/489 |
| 5,629,860 | * 5/1997 | Jones et al. | 364/490 |
| 5,655,109 | * 8/1997 | Hamid | 395/500 |
| 5,726,902 | * 3/1998 | Mahmood et al. | 364/489 |
| 5,754,826 | * 5/1998 | Gamal et al. | 395/500 |
| 5,761,081 | * 6/1998 | Tomita et al. | 364/490 |

(List continued on next page.)

FOREIGN PATENT DOCUMENTS 3-288270   12/1991 (JP) .
07-239865  12/1995 (JP) .

OTHER PUBLICATIONS

L. Dahl et al., Development of an ASIC Macrocell CAD System, IEEE ASIC Seminar and Exhibit, pp. 1/1.1–11/1.4, Sep. 1990.*

F. Chang et al., An Accurate and Efficient Gate Level Delay Calculator for MOS Circuits, ACM/IEEE Design Automation Conference, pp. 282–287, Jun. 1988.*

(List continued on next page.)

*Primary Examiner*—Matthew Smith
*Assistant Examiner*—A. M. Thompson
(74) *Attorney, Agent, or Firm*—Staas & Halsey LLP

(57) ABSTRACT

A method conducts logic simulation in an integrated circuit device, in which a macro containing logic circuits formed therein is included in a chip including a plurality of cells. The method determines a first delay parameter relating to an input terminal of an internal cell of the macro connected to the input terminal of the macro, and a second delay parameter relating to an output terminal of an internal cell of the macro connected to the output terminal of the macro. The method then determines delay time data for a whole logic circuit including the plurality of cells and the macro, in accordance with delay parameters determined for the macro, in which the first delay parameter is taken as an input terminal delay parameter and the second delay parameter is taken as an output terminal delay parameter; delay parameters determined for the plurality of cells; and connection data for the whole logic circuit. The method merges the determined delay time data for the whole logic circuit and internal delay time data for the macro so as to conduct a logic simulation for the whole logic circuit in accordance with the merged delay time data.

10 Claims, 35 Drawing Sheets

FLOWCHART OF FIRST EMBODIMENT OF THE PRESENT INVENTION

FLOWCHART OF SECOND EMBODIMENT OF THE PRESENT INVENTION

U.S. PATENT DOCUMENTS

| | | | |
|---|---|---|---|
| 5,768,130 | * | 6/1998 | Lai .......................................... 364/489 |
| 5,774,371 | * | 6/1998 | Kawakami ............................ 364/491 |
| 5,787,092 | * | 7/1998 | Jaynes et al. ........................ 371/22.1 |
| 5,796,985 | * | 8/1998 | O'Brien et al. ....................... 395/500 |
| 5,818,727 | * | 10/1998 | Sekiguchi .............................. 364/490 |
| 5,822,217 | * | 10/1998 | Shenoy .................................. 364/488 |
| 5,838,947 | * | 11/1998 | Sarin ..................................... 395/500 |
| 5,850,355 | * | 12/1998 | Molnar .................................. 364/578 |
| 5,852,445 | * | 12/1998 | Yoshikawa et al. .................. 345/440 |
| 5,870,308 | * | 2/1999 | Dangelo et al. ....................... 364/489 |
| 5,886,900 | * | 3/1999 | Gascoyne et al. .................... 364/490 |
| 5,903,468 | * | 5/1999 | Misheloff et al. .................... 364/488 |
| 5,903,475 | * | 5/1999 | Gupte et al. .......................... 364/578 |
| 5,910,901 | * | 6/1999 | Yamada ................................ 364/578 |
| 5,933,358 | * | 8/1999 | Koh et al. ............................. 364/578 |
| 5,956,257 | * | 9/1999 | Ginetti et al. ......................... 364/490 |
| 6,012,833 | * | 1/2000 | Yoshikawa ...................... 364/468.28 |

OTHER PUBLICATIONS

L. Schwoerer et al., Integration of VHDL into A System Design Environment, European Design Automation Conference, 1995, pp. 268–273, Sep. 1995.*

K. Anshumali, ACC: Automatic Cell Characterization, Euro ASIC '91, pp. 204–209, May 1991.*

T. Ekenberg, The University of Pennsylvania Integrated Circuit Design Environment, IEEE Nuclear Science Symposium and Medical Imaging Conference, 1994, pp. 25–29, Oct. 1994.*

M.A. Cirit, Characterization a VLSI Standard Cell Library, IEEE Custom Integrated Circuits Conference, 1991, pp. 25.7/1—25.7/4, May 1991.*

T. Toyoda et al., A Fully Integrated Charateization and Management System for ASIC Libraries, IEEE ASIC Conference Exhibit, 1992, pp. 245–248 Sep. 1990.*

* cited by examiner

FLOW-CHART OF MANUFACTURING FOR SEMICONDUCTOR INTEGRATED CIRCUIT

FIG. 2
EXAMPLE OF DATA STRUCTURE OF STANDARD CELL
```
Cell X
  ├── Function (Logic data)
  ├── P1
  ├── t2
  ├── P3
  └── Input capacitance, output capacitance
```
FIG. 3 PRIOR ART
CHARACTERIZATION OF STANDARD CELL
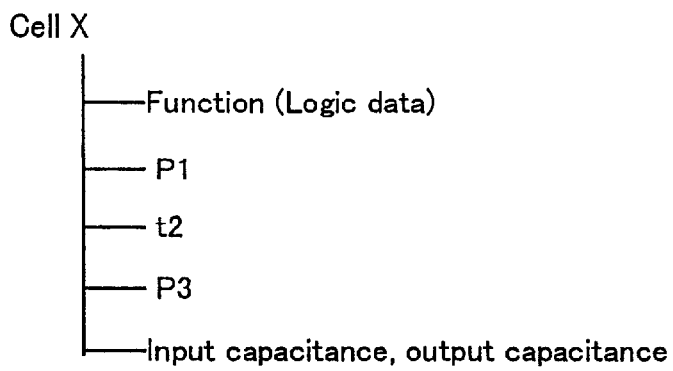
FIG. 4
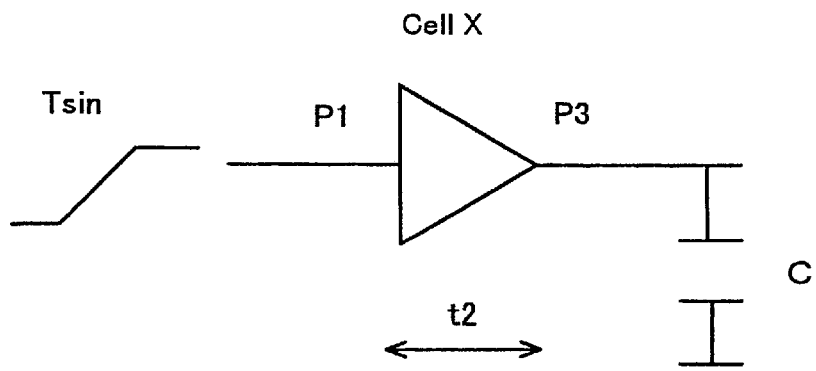
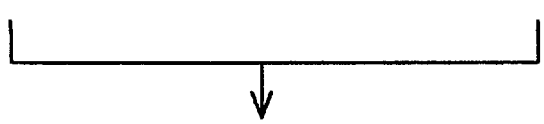

EXAMPLE OF LOGIC CIRCUIT

EXAMPLE OF NET LIST

```
Port:
 INPUT : A, B:
 OUTPUT: C
EndPort
Net:
 Net-1: pA, Xpa;
 Net-2: pB, Ypb;
 Net-3: Xpb, Ypa;
 Net-4: pC, Ypc;
EndNet;
```

EXAMPLE OF ATTRIBUTE DATA OF MACRO

LSI DESIGN SYSTEM

FLOWCHART OF CONVENTIONAL LOGIC INSPECTION METHOD FOR LSI

SIMULATION CIRCUIT FOR GATHERING THE CHARACTERISTICS
OF LOGIC CELLS WHICH HAVE BEEN SUBJECTED TO
A CONVENTIONAL LSI CIRCUIT LOGIC INSPECTION METHOD

DIAGRAMS FOR DESCRIBING CHANGES IN THE DELAY TIME AND THE OUTPUT THROUGH-RATE FOR A LOGIC CELL WHEN THE INPUT THROUGH-RATE IS TAKEN AS A VARIABLE ELEMENT

SIMULATION CIRCUIT FOR GATHERING LOGIC CELL CHARACTERISTICS IN A CASE WHERE THE INPUT THROUGH-RATE IS TAKEN AS A VARIABLE ELEMENT

DIAGRAM ILLUSTRATING THE RELATIONSHIP BETWEEN OUTPUT
LOAD CAPACITANCE CL AND DELAY TIME TGATE, FOR LOGIC CELL
HAVING A CIRCUIT THRESHOLD VOLTAGE WHICH IS LOWER OR HIGHER
THAN THE AVERAGE CIRCUIT THRESHOLD VOLTAGE

DIAGRAM FOR DESCRIBING THE MECHANISM INVOLVED WHEN THE DELAY TIME FOR LOGIC CELL HAVING A CIRCUIT THRESHOLD VOLTAGE LOWER OR HIGHER THAN THE AVERAGE CIRCUIT THRESHOLD VOLTAGE Vth-AV ASSUMES A NEGATIVE VALUE

DIAGRAMS FOR DESCRIBING THE MECHANISM INVOLVED WHEN THE DELAY TIME TGATE23 OF THE LOGIC CELL 23 TAKES A NEGATIVE VALUE

DIAGRAMS FOR DESCRIBING THE MECHANISM INVOLVED WHEN
THE DELAY TIME TGATE24 FOR LOGIC CELL 24 TAKES A NEGATIVE VALUE

FLOWCHART OF FIRST EMBODIMENT OF THE PRESENT INVENTION

DIAGRAM FOR DESCRIBING A METHOD OF DETERMINING A RISING WAVEFORM CIRCUIT THRESHOLD VOLTAGE Vth-UP AND A FALLING WAVEFORM CIRCUIT THRESHOLD VOLTAGE Vth-DOWN

EXAMPLE OF A RISING WAVEFORM CIRCUIT THRESHOLD VOLTAGE Vth-UP
AND A FALLING WAVEFORM CIRCUIT THRESHOLD VOLTAGE Vth-DOWN

4 INPUT NOR CIRCUIT HAVING CMOS STRUCTURE

DIAGRAMS FOR DESCRIBING A METHOD OF DETERMINING A RISING WAVEFORM CIRCUIT THRESHOLD VOLTAGE Vth-UP AND FALLING WAVEFORM CIRCUIT THRESHOLD VOLTAGE Vth-DOWN FROM DC CHARACTERISTICS

DIAGRAMS FOR DESCRIBING A METHOD OF DETERMINING A RISING WAVEFORM CIRCUIT THRESHOLD VOLTAGE Vth-UP AND FALLING WAVEFORM CIRCUIT THRESHOLD VOLTAGE Vth-DOWN FROM AC CHARACTERISTICS

DEFINITION OF DELAY TIME FOR LOGIC CELL

DEFINITION OF DELAY TIME FOR LOGIC CELL

DELAY TIME OF CONNECTED LOGIC CELLS

DELAY TIME OF CONNECTED LOGIC CELLS

A DIAGRAM FOR DESCRIBING HOW NO NEGATIVE VALUES ARE GENERATED FOR THE LOGIC CELL DELAY TIME, WHEN THE LOGIC CELL DELAY TIME IS DEFINED AS SHOWN IN FIG. 28 AND FIG. 29

DIAGRAM FOR DESCRIBING A METHOD OF DETERMINING SUITABLE CIRCUIT THRESHOLD VOLTAGES, APPLIED TO A CASE OF IN-SYSTEM INSPECTION

DIAGRAM FOR DESCRIBING A METHOD OF DETERMINING SUITABLE CIRCUIT THRESHOLD VOLTAGES, APPLIED TO A CASE OF IN-SYSTEM INSPECTION

FLOWCHART OF SECOND EMBODIMENT OF THE PRESENT INVENTION

DEFINITION OF DELAY TIME FOR LOGIC CELL

DEFINITION OF DELAY TIME FOR LOGIC CELL

DIAGRAM FOR DESCRIBING THE OPERATION OF CONVERTING LOGIC CELL DELAY TIMES IMPLEMENTED WHEN CALCULATING LSI CIRCUIT DELAY TIME BY MEANS OF A DELAY TIME CALCULATING PROGRAM IN THE SECOND EMBODIMENT OF THE PRESENT INVENTION

METHOD OF MANUFACTURING INTEGRATED CIRCUIT DEVICE

BACKGROUND OF THE INVENTION

1. Field of the Invention

The present invention relates to a method of manufacturing a semiconductor or other integrated circuit device, and.more particularly, to a method of logic simulation in design processes conducted prior to fabrication onto a semiconductor wafer, and a method of calculating delay time for a logic circuit.

2. Description of the Related Art

Semiconductor integrated circuit devices are steadily reaching higher levels of integration. Alongside this, ASICs (Application Specification Integrated Circuits), such as gate arrays, embedded arrays, standard cells, and the like, are also becoming increasingly complex.

In a standard ASIC design, logic data for a plurality of cells or macro cells designed according to certain design rules, and corresponding physical data such as pattern data etc., are set in a library, and logic design is carried out using cells and macro cells previously recorded in this library. Therefore, in the delay time calculating process and logic simulation process conducted after logic design, the calculating tools and logic simulation tools provided according to the design rules are used.

A semiconductor integrated circuit is designed by a design automation process using the data library and program tools described above, and the operation of the circuit is then verified. Thereupon, an actual pattern for forming an actual chip is designed according to this design data, and the manufacturing process then moves onto the process of actual fabrication onto a semiconductor wafer.

However, in recent years, techniques have been proposed for manufacturing ASICS, wherein large-scale macros designed according to third party design rules are buried in a chip. Namely, in these techniques, rather than just cells or macro cells (large-scale cells) from a given library, a large-scale macro, e.g. an ALU, CPU or MPU, designed on the basis of completely different design rules, is buried in the same chip. These large-scale macros may be recorded in a library along with standard cells from the ASIC vendor, or third party macros obtained from the client may be used in combination with standard cells from a library.

Macros which have a certain value in the market and are standardized may be used more frequently, but there is also a demand for the use of macros, which are not valued in the market, but which are either existing macros or third-party designed macros, etc., in order to reduce the design steps involved for the client.

In this case, the question of how to carry out a logic simulation for verifying the operation of the chip as a whole presents a significant problem. In particular, in the process of calculating the delay time in the circuit network, which is necessary for carrying out a logic simulation, it is a very difficult problem to determine how to merge (combine) macros based on different design rules with standard cells.

A simple method would be start by implementing a characterizing process for determining respective delay parameters for all internal cells in the third party macros, and then to calculate the delay time for the chip as a whole using these characterized delay parameters. However, a method which involves a characterizing process from the start for all cells in large-scale macros would require an extraordinarily high number of steps, and is not compatible with the objective of using existing third-party macros. Therefore, a method which resolves these problems is sought.

A process for calculating delay time conducted after logic design and prior to the aforementioned logic simulation process would lead to variations in circuit threshold voltage in the cells and macros in the chip as the chip grows in scale, thereby increasing complexity.

In other words, the delay time for cells or macros (circuit units comprising a plurality of cells) varies depending on the input through-rate of the input signal supplied to the input terminal and the load capacitance connected to the output terminal. Furthermore, the output through-rate generated at the output terminal varies depending on the aforementioned input through-rate and the load capacitance connected to the output terminal. Therefore, in order to discover the delay time in the cells and macros, it is necessary to form a logic circuit and then determine the input through-rate found from the output and connections from the previous circuit stage, and the load capacitance of the next circuit stage connected to the output terminal. The input-side parameter for determining the delay time of the cell according to this input through-rate and the load capacitance, and the output-side parameter for determining the output through-rate for the cell similarly according to the input through-rate and the load capacitance are recorded in the cell library.

However, if the circuit threshold voltage varies for each cell or macro, as described above, then it becomes necessary to incorporate in the aforementioned delay time calculating process a step of determining the delay time according to a different threshold voltage for each cell, and a step of making corrections for mismatching between the threshold voltage of the previous circuit stage and the threshold voltage of the next circuit stage. If, in order to avoid this, the delay time is determined by setting an average threshold voltage for all the cells, there will be mismatching between the threshold voltages of the actual cells and the aforementioned average threshold voltage, and in cases where the cell delay times are extremely short, negative values may be produced.

Such negative delay times are not suitable and converting them unconditionally to zero means that the delay times in the logic circuit will ultimately be inaccurate.

SUMMARY OF THE INVENTION

Therefore, an object of the present invention is to resolve the aforementioned problems by providing at method for conducting logic simulations at chip level for an ASIC containing macros, by means of a small number of steps.

A further object of the present invention is to provide a method of manufacturing a semiconductor integrated circuit comprising a logic simulation step which can be implemented with respect to an ASIC containing macros, by means of a small number of steps.

A further object of the present invention is to provide a method of manufacturing an integrated circuit, wherein the delay time for a semiconductor integrated circuit is calculated accurately and in a short period of time, thereby allowing a highly accurate integrated circuit logic simulation to be conducted.

In order to achieve the aforementioned objects, in a method of manufacturing an integrated circuit device, wherein a macro containing logic circuits formed therein is buried inside a chip including a plurality of cells, the method comprises the steps of; characterising in order to determine a first delay parameter relating to the input terminal of an internal cell of the macro connected to the input terminal of the macro, and a second delay pararmeter relating to the output terminal of an internal cell of the macro connected to the output terminal of the macro; determining delay time data for a whole logic circuit including the plurality of cells and the macro, in accordance. with delay parameters for said macro, wherein said first delay parameter is taken as an input terminal delay parameter and said second delay parameter is taken as an output terminal delay parameter, delay parameters for said plurality of cells, and connection data for said whole logic circuit; and merging said determined delay time data for the whole logic circuit and internal delay time data for said macro so as to conduct a logic simulation for said whole logic circuit in accordance with this merged delay time data.

When a macro designed on the basis of different design rules to the plurality of cells is buried in a chip, it is possible to determine delay time data for the chip as a whole by means of a small number of steps, by merging the internal delay time data relating to the macro and delay time data for the whole logic circuit determined by regarding the macro as a standard cell. Therefore, it is possible to conduct a logic simulation process using this data by means of a short procedure. Even if the design rules are different, provided that the delay time data is recorded according to the SDF (Standard Delay Format) standardized by the IEEE, the data will be compatible, and therefore the aforementioned merging process will be possible. The delay parameters relating to the delay time at the input terminal and output terminal of the macro are determined in the characterizing step, and the delay time in the whole logic circuit is determined using these delay parameters.

More specifically, the aforementioned first delay parameter is a parameter dependent on an input through-rate, and an input delay time of said macro is determined from the input through-rate according to the logic circuit and the first delay parameter.

Furthermore, the second delay parameter is a parameter dependent on an output load capacitance, and the output delay time is determined from the load capacitance according to the logic circuit and the second delay parameter.

In a method of manufacturing an integrated circuit device including a plurality of logic cells, a second invention for achieving the aforementioned objects comprises the steps of: calculating the delay time for a whole logic circuit, wherein said plurality of logic cells are connected, by setting the circuit threshold voltage for said logic cells to equal to or less than the lowest circuit threshold voltage of said plurality of logic cells, when the input waveform is a rising wave, and setting it to equal to or greater than the highest circuit threshold voltage of said plurality of logic cells, when the input waveform is a falling wave; and conducting a logic simulation of said whole logic circuit in accordance with said determined delay time for the whole logic circuit.

According to the aforementioned second invention, even if the circuit threshold voltage is set to the same value for a plurality of logic cells, a negative delay time for logic cells will not be produced due to mismatching with respect to the actual threshold voltage for logic cells. Furthermore, it is possible to apply the same delay time calculating step to all of the logic cells, thereby allowing the calculating time to be reduced significantly. Moreover, since the threshold voltage is matched between the logic cells in the preceding and the next circuit stage, it is not necessary to correct the delay times between the logic cells. Furthermore, the second invention is not required to be applied to all the logic circuits in the chip. For example, it may be applied to logic circuits comprising a plurality of logic cells in one portion of the chip. It may also be applied to logic circuits in a macro comprising a plurality of logic cells.

BRIEF DESCRIPTION OF THE DRAWINGS

FIG. 2 shows an example of data structure for a standard cell;

FIG. 3 is a diagram for describing the characterization of a standard cell;

FIG. 4 is a diagram describing the process of determining delay time from delay parameters and the input through-rate and load capacitance of a logic circuit;

DESCRIPTION OF THE PREFERRED EMBODIMENTS

Below, embodiments of the present invention are described with reference to the drawings. However, the technical scope of the present invention is not limited to these embodiments.

Figure 1:
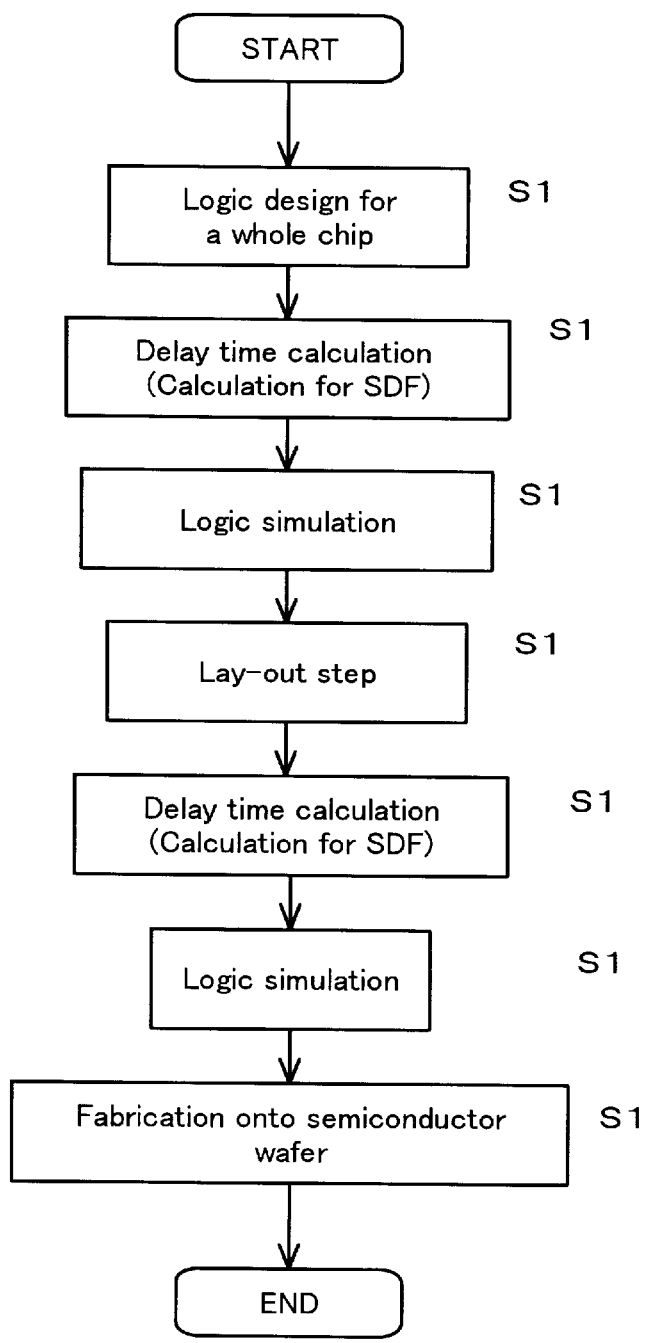
FIG. 1 is a flowchart of manufacturing steps for a semiconductor integrated circuit according to a mode for implementing the present invention.

FIG. 1 is a flow-chart of manufacturing steps for a semiconductor integrated circuit according to a first embodiment of the present invention. In this flow-chart example, firstly, the logic design for a whole chip is carried out using cells, and the like, previously recorded in a logic library (S10). In this embodiment of the present invention, macros provided by a third party are used at the same time as standard cells from the logic library. These macros have already undergone logic design and logic simulation processes, and are completed up to the design stage of an actual mask pattern. As a result of this logic design, a net list is created for a network of logic circuits.

Next, the delay times in the circuit network are calculated for the designed logic circuits (S11). These delay times include: delay time at the input terminal of cells provided in the circuit network, delay time in cells themselves, delay time at the output terminal, and the like. In general, the delay time at the input terminal is determined in accordance with the drive capacity from the preceding cell and the input through-rate derived from the wiring capacitance. The delay time at the output terminal is determined in accordance with the load capacitance of the wiring to the next cell and the capacitance to be driven, such as the capacitance of the next cell input terminal. Therefore, for cells recorded in the logic library, a delay parameter showing dependence on the input through-rate and a delay parameter showing dependence on the output load are given as characterizing data.

Accordingly, the delay time in the circuit network is calculated on the basis of the net list determined at step S10 and delay parameter of each cell. Preferably, this delay time should be recorded in accordance with the SDF (Standard Delay Format) standardized by the IEEE. Even if logic circuits are fabricated on the basis of different design rules, this SDF allows the delay times in the circuit network to be expressed by standardized delay times in a standardized format. Consequently, it is possible to use a variety of logic simulation programs for delay time data recorded using SDF.

Next, a logic simulation is conducted using the logic function and delay time data in SDF format for each cell, and a test pattern (S12). In this logic simulation, it is confirmed that logic circuit operations are executed correctly, for instance, whether or not the output pattern expected for an input prescribed test pattern is output at the expected timing. In other words, in the logic simulation, a logic verification is carried out. In the logic simulation step, if it is confirmed that the circuit provisionally operates correctly as a logic circuit, a lay-out step for each cell and wire in the chip is implemented (S13).

Delay time calculation (Sl4) and logic simulation (S15) as described above are carried out again on the basis of this layout, and the operation in this layout state on the chip is confirmed again. When this has been completed, the sequence proceeds ultimately to the step of fabrication onto the semiconductor wafer.

The foregoing was a summary of manufacturing steps for a semiconductor integrated circuit. Here, before describing the aforementioned process of calculating delay time for the purpose of conducting a logic simulation for an ASIC containing a macro, a brief description is given of the characterization of standard, general cells, delay parameters, standard cell data examples, and logic circuit net lists and delay time calculation.

Standard Cell Data Examples

FIG. 2 is a diagram showing an example of the data structure of a standard cell. This example shows a data structure for cell X. The attribute data for cell X comprises, at the least, logic function (Function) data relating to the cell, delay parameters P1, t2, P3, and the input terminal capacitance and output terminal capacitance. Here the delay parameters P1, t2, P3 are described.

Characterization of Standard Cell and Delay Parameters

FIG. 3 is a diagram for describing the characterization of a standard cell. FIG. 3 shows an example of cell X. The logic function of cell X may be a flip-flop, for example, and it may be an "AND" function, "OR" function, or an "EXCLUSIVE OR" function. This cell X comprises a delay time at the input terminal which is dependent on the input through-rate TSin at the input terminal, the delay time t2 of the cell itself, and the delay time at the output terminal which is dependent on the cell drive capacity and the driven load capacitance, and the like (output through-rate).

The input through-rate TSin is the upward slope of the input signal, for example, and it is dependent on the output drive capacity of the previous cell and the load capacitance of the wiring, etc. If the slope is very steep, then this means that the input through-rate is small and the delay time at the input terminal is short. The load capacitance CL is the capacitance provided by the output terminal at the previous stage and the wiring etc. up to the cell in the next stage.

The delay time at the input terminal of cell X is dependent on the input through-rate TSin described above, and generally, if the input through-rate is small, the delay time is short. Therefore, if the delay parameter P1 is given for the input terminal of the cell X, and a logic circuit is designed and the input through-rate is derived from this logic circuit, then the delay time t1 at the input terminal can be determined from the delay parameter P1 and the input through-rate TSin. Consequently, the delay parameter P1 is given as attribute data for the cell X.

Furthermore, the delay time at the output terminal of cell X is dependent on the aforementioned load capacitance CL, and generally the delay time increases as the load capacitance CL rises. Therefore, if the delay parameter P3 is given for the output terminal of cell X, and a logic circuit is designed and the load capacitance CL is derived from this logic circuit, then the delay time t3 at the output terminal can be determined from the delay parameter P3 and the load capacitance CL.

FIG. 4 is a diagram illustrating the process of determining delay time from the delay parameters and the input through-rate and load capacitance of the logic circuit. As described previously, the design parameters (P1, t2, P3) are extracted from cell X attribute data in the logic library, and the delay time t1 of the input terminal, the delay time t2 of the cell itself, and the delay time of the output terminal t3 are determined according to the input through-rate TSin and the load capacitance CL given by the logic circuit. The determined delay times are recorded in the aforementioned SDF format.

The delay parameters described in FIG. 3 are determined in the characterizing step for cell X. This characterizing step lo may be conducted, for example, using a 'spice' simulator, such as the 'Hspice' (trade name) manufactured by Metasoft Co. Ltd. In this simulator, the delay parameters P1, P3 are determined by providing characteristics parameters for transistors comprising cells and a net list indicating the connection relationships of these transistors. More specifically, on the basis of the given transistor characteristics parameters and net list, the delay parameter P1 for the input terminal is determined from the delay time at the input terminal when the input through-rate TSin is changed, and the delay parameter P3 for the output terminal is determined from the delay time at the output terminal when the load capacitance CL connected to the output terminal is changed.

For standard cells, the delay parameters (P1, t2, P3) are determined by the 'spice' simulator from transistor characteristics parameters and net lists for the cells previously recorded in the logic library. These delay parameters are given in the form of cell attribute data, as described previously.

Figure 16A:
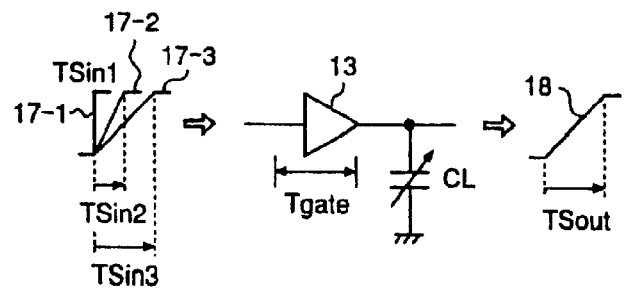
FIGS. 16A–16C are diagrams for describing changes in the delay time and output through-rate of a logic cell, in a case where the input through-rate is taken as a variable element.
Figure 16B:
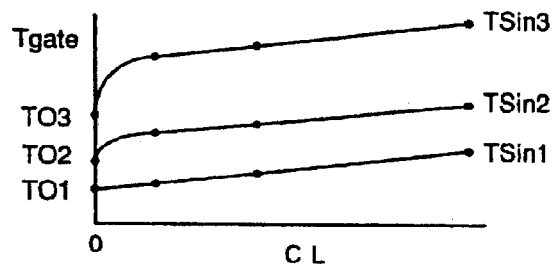
Figure 16C:
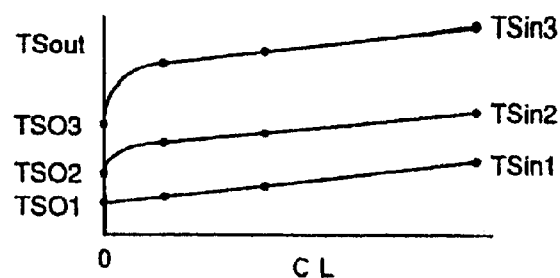

FIG. 16 shows specific examples of the aforementioned parameters. In FIG. 16A, input signals 17-1–17-3 having three different input through-rates TSin1–3 are supplied to the input terminal of a cell 13, and an output signal 18 having an output through-rate of TSout is generated at the output terminal, which is connected to a load capacitance CL. FIGS.16B and 16C illustrate these parameters. FIG. 16B shows the delay time Tgate of the cell 13, which is dependent on the input through-rate TSin and the load capacitance CL. The delay time when the input through-rate TSin is shortest and the load capacitance CL is zero provides the delay time t2 intrinsic to the cell 13. FIG. 16C shows the output through-rate TSout which is dependent on the input through-rate TSin and the load capacitance CL. More specifically, the data marked by the black dots in FIGS.16B and 16C are recorded as delay parameters, the input through-rate and load capacitance determined after forming a logic circuit are given, and the respective values for the delay time Tgate and the output through-rate TSout are calculated.

Net List

Figures 5, 6:
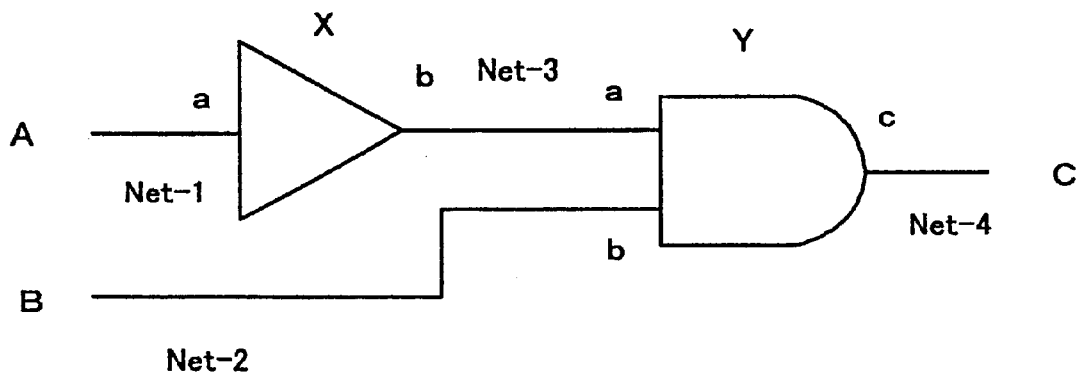
FIG. 5 shows an example of a logic circuit.
FIG. 6 shows an example of a net list for the logic circuit illustrated in FIG. 5.

FIG. 5 shows an example of a logic circuit. FIG. 6 shows an example of a net list for the logic circuit shown in FIG. 5. In the logic circuit example shown in FIG. 5, cell X and cell Y are connected between the logic circuit input terminals A, B and the output terminal C. Cell X comprises input terminal b (port) a and output terminal b, whilst cell. Y comprises input terminals a, b and output terminal c. These are connected respectively to wires Net-1–Net-4.

The net list for the logic circuit example illustrated in FIG. 5 is recorded as shown in FIG. 6, for example. In other words, the input terminal and output terminal ports (Port) are A, B, and C, and these ports are recorded as pA, pB, pC, whilst the input terminals and output terminals for each cell are recorded as Xpa, Ypb, and so on. The respective wires Net-1–Net-4 are noted as shown in the diagram. In this example, the port names at both ends of each respective wire are described. The net list becomes logic circuit attribute data, when the logic design process (S10 in FIG. 1) is completed.

As can be seen from the foregoing, firstly, the delay parameters are found in the cell characterizing step, and these parameters are recorded as cell attribute data. Then, a logic circuit net list is formed as a result of a logic design step. The input through-rate and load capacitance for each cell is determined from this net list. The delay time of the logic circuit is determined from the delay parameters and the input through-rate and load capacitance. Thereupon, a logic simulation is carried out based on the cell logic functions and the delay time data (SDF format) determined above.

ASIC Including Macro

Figure 7:
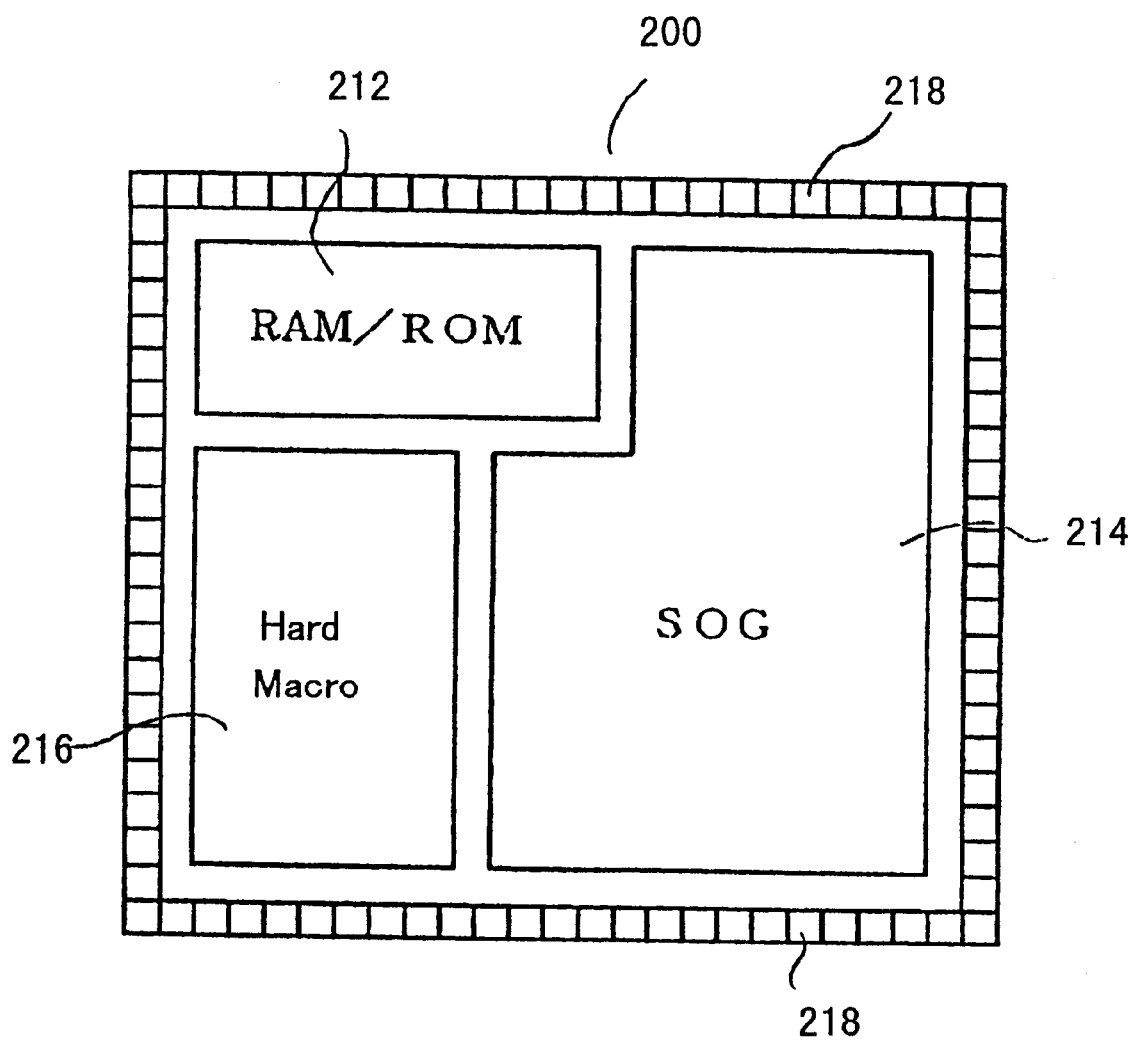
FIG. 7 shows an example of the composition of a whole chip forming an ASIC comprising a macro.

FIG. 7 shows a compositional example of an entire chip forming an ASIC which contains a macro. In this example, a group of gate arrays SOG (Sea of Gates) 214, a memory cell 212, and a macro 216 supplied by a third party are formed on a chip 200. A plurality of input and output cells 218 are provided around the perimeter of the chip 10.

In cases where a macro 216 supplied by a third party is combined in a chip in this way, the problem arises of how to calculate delay times which are necessary for the logic simulation process described above. Specifically, with a macro fabricated according to different design principles, it is impossible to obtain the delay parameters for the cells in the macro, and therefore delay times cannot be calculated using the delay parameters for each cell and the input through-rate and load capacitance derived from the macro net list.

Figure 8:
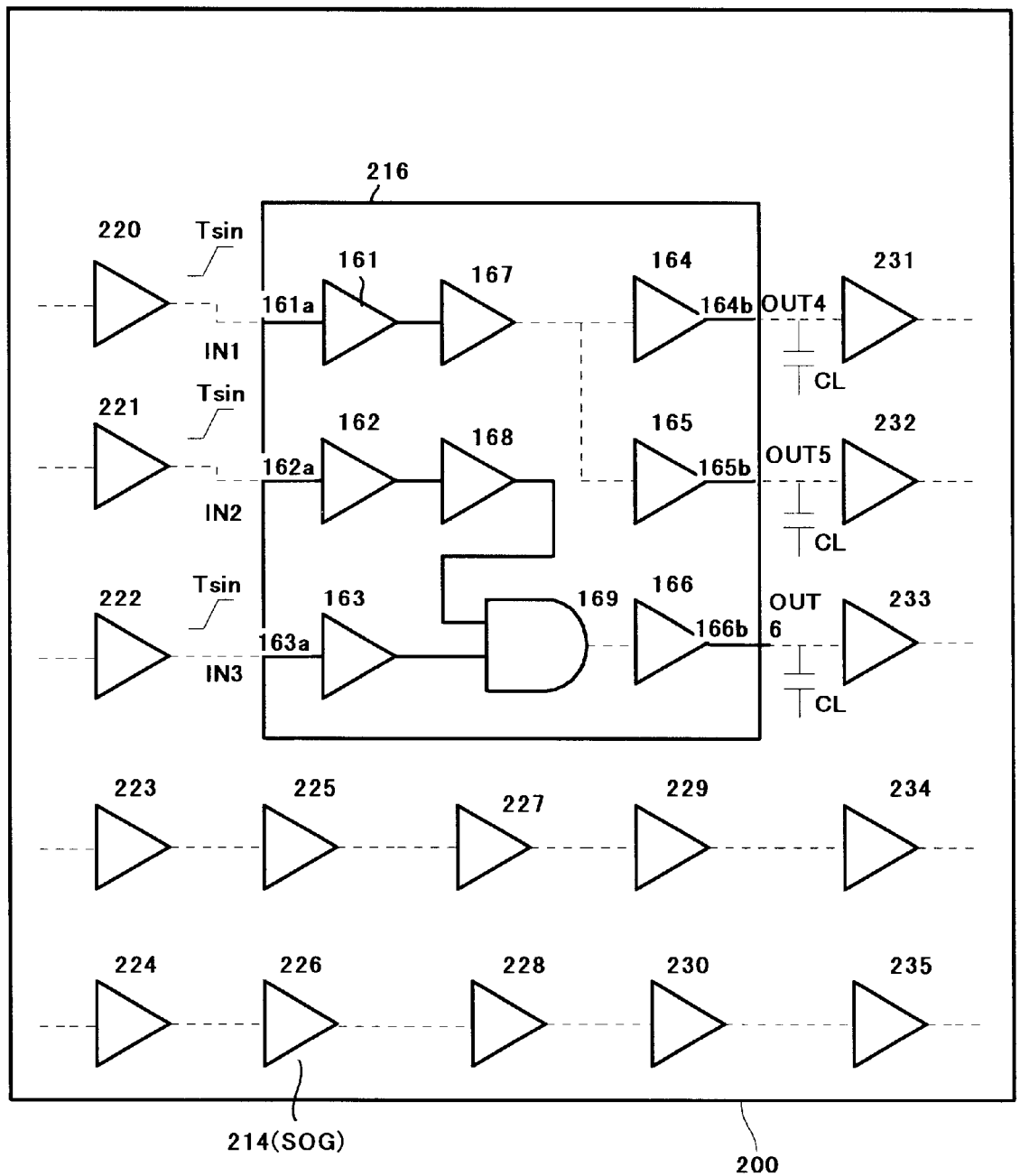
FIG. 8 shows a composition involving a combination of a macro and standard cells, in order to describe a logic simulation process according to a mode for implementing the present invention.

FIG. 8 illustrates a composition involving a combination of a macro and standard cells, in order to describe the logic simulation step according to the embodiment of the present invention. In this example, a macro 216 contains internal cells 161, 162, 163 connected respectively to input terminals IN1, IN2, IN3 of the macro. It also contains internal cells 164, 165, 166 connected respectively to output terminals OUT4, OUT5, OUT6 of the macro. Furthermore, the macro contains internal cells 167, 168, 169. The solid lines and dotted lines in FIG. 8 illustrate connection examples. The gate array 214 comprises standard cells 220–235. The dotted lines connecting these are simply given as examples.

The composition shown in FIG. 8 is obtained when the logic design step (S10) in FIG. 1 for the whole chip has been completed. This composition is noted accordingly in a net list including the macro 16.

Figure 9:
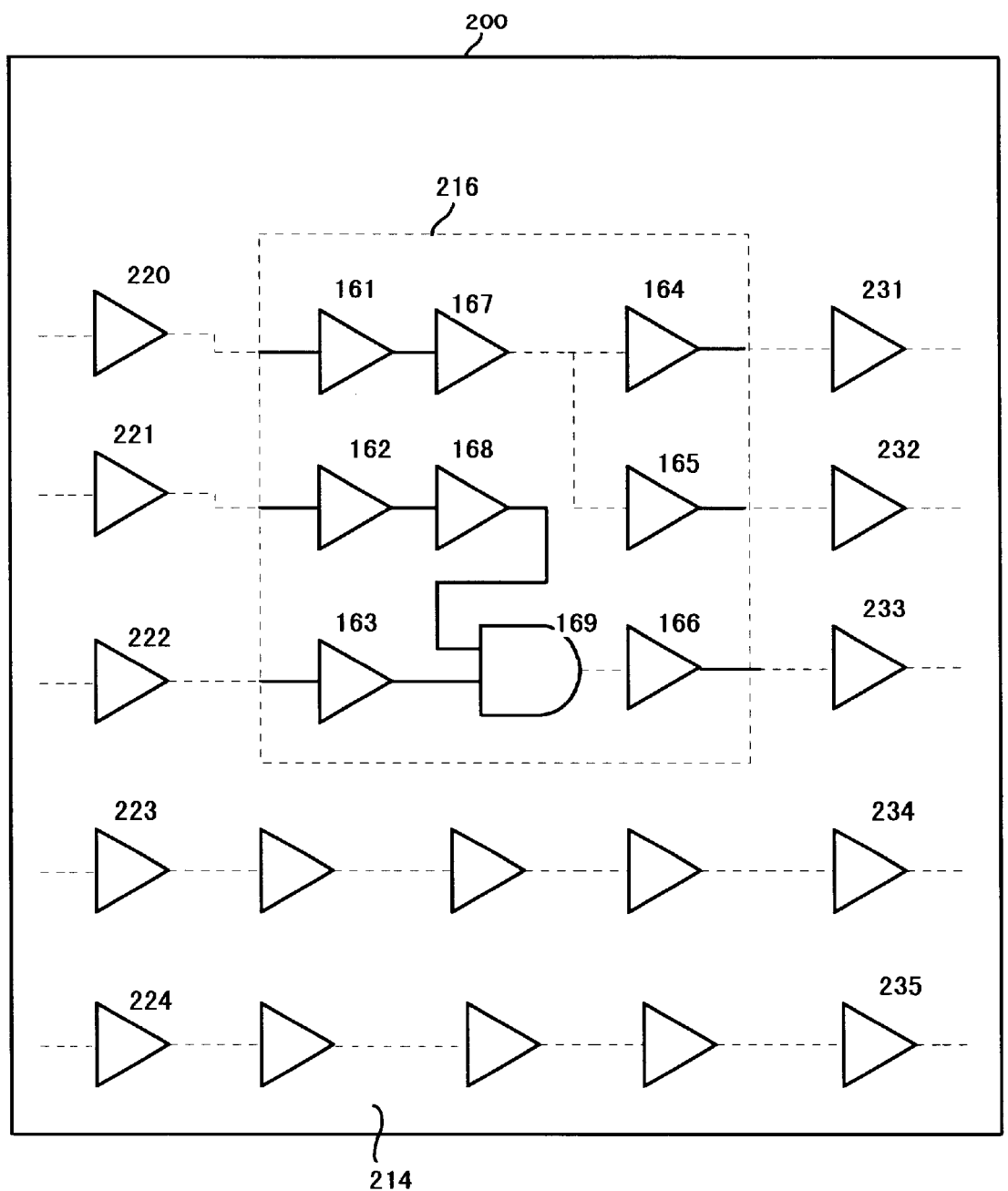
FIG. 9 shows a composition involving a combination of a macro and standard cells, in order to describe a logic simulation process according to a mode for implementing the present invention.

As shown above, usually, it is impossible to know characterized delay parameters for the cells 161–169 in the macro 216. Therefore, it has been conceived that all these internal cells can be characterized using a 'Spice' simulator and the transistor properties parameters and net list for the respective cells. As a result, the delay times in the chip 200 can be calculated by setting the cells 161–169 in the macro 216 and the cells 220–235 in the gate array 214 to similar levels, as shown in FIG. 9, and using their delay parameters and the net lists for all the cells. However, since the macro 216 itself contains an enormous number of cells, the process of characterizing all the cells 161–169 in the macro would require a huge number of steps, which makes this method impracticable.

Therefore, in the embodiment of the present invention, the number of steps involved in calculating the delay times necessary for running a logic simulation is reduced significantly by regarding the contents of the macro 216 as a black box and treating the macro 216 as a cell equivalent to the standard cells.

Since the macro is supplied by a third party, the delay parameters for the internal cells of the macro cannot be obtained. Moreover, even if these delay parameters could be obtained, this delay parameter data would be based on different design rules and would therefore be incompatible with the design parameters for the standard cells. However, the macro is a type of LSI whose operation has already been confirmed by logic simulation, and which has been completed to the mask pattern stage. Therefore, delay times conforming to the SDF format can be provided as macro attribute data.

By merging this SDF delay time data for the macro with SDF delay time data calculated from a logic circuit of standard cells in the gate array 214, it is possible to reduce significantly the number of steps involved in calculating delay times for the whole chip, which are necessary for running logic simulations.

Figure 10:
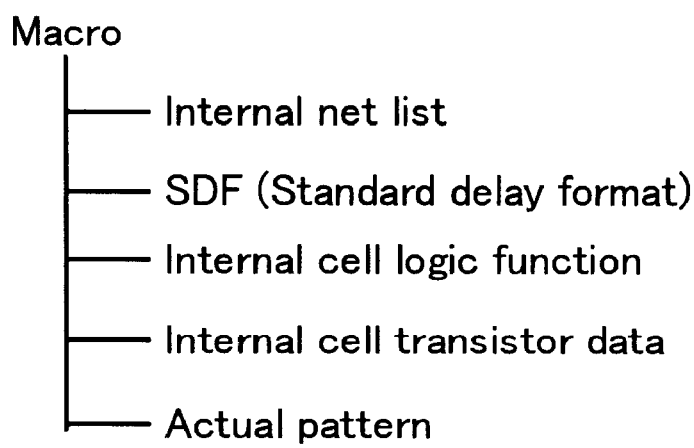
FIG. 10 shows an example of macro attribute data.

FIG. 10 shows an example of macro attribute data. In this example, the attribute data comprises: a macro internal net list; data for delay times in the circuit network inside the macro, recorded in SDF format; internal cell logic functions (Function); internal cell transistor data; and the actual pattern for the macro. This SDF delay time data is compatible with the delay time data recorded in SDF format for the standard cell logic circuit. This is because SDF is a standardized format for recording delay times devised by the IEEE.

Hence, the SDF delay time in the macro 216 and the SDF delay time for the standard cell logic circuit in the gate array 214 are merged. In this case, if the chip contains a macro 216 combined with standard cells in a gate array 214, as shown in FIG. 8, then the input through-rate to the input. terminal IN1, IN2, IN3 of the macro 216 cannot be obtained unless the logic circuit for the whole chip has been designed. This is because the input through-rate is dependent on the cells 220, 221, 222 in the previous circuit stage, and the load capacitance of the wiring between these and the macro 216. Similarly, the load capacitance CL to the output terminals OUT4–OUT6 of the macro 216 cannot be obtained unless the logic circuit for the whole chip has been designed, since the load capacitance at the output terminals CL is dependent on the length of wiring between the macro 216 and the cells in the next circuit stage, etc.

Consequently, since the delay times at the input terminals and output terminals of the macro 216 are dependent on the logic circuit in the gate array, the SDF delay time data supplied as macro attribute data cannot be used directly.

Therefore, in the characterising step of the embodiment of the present invention, of the cells in the macro 216, the delay parameters at the input terminals 161a–163a and the output terminals 164b–164b are found only for the cells 161–166 connected to the input terminals IN1~IN3 and output terminals OUT4~OUT6, by means of a 'Spice'simulator. Only the input terminal delay parameters for the cells 161–163 on the input side are sufficient, and the delay times for the cells 161–163 themselves or their output delay times do not need to be determined. Similarly, only the output terminal delay parameters for the cells 164–166 on the output side are sufficient. Therefore, the characterizing process does not require such a high number of steps.

Figure 11:
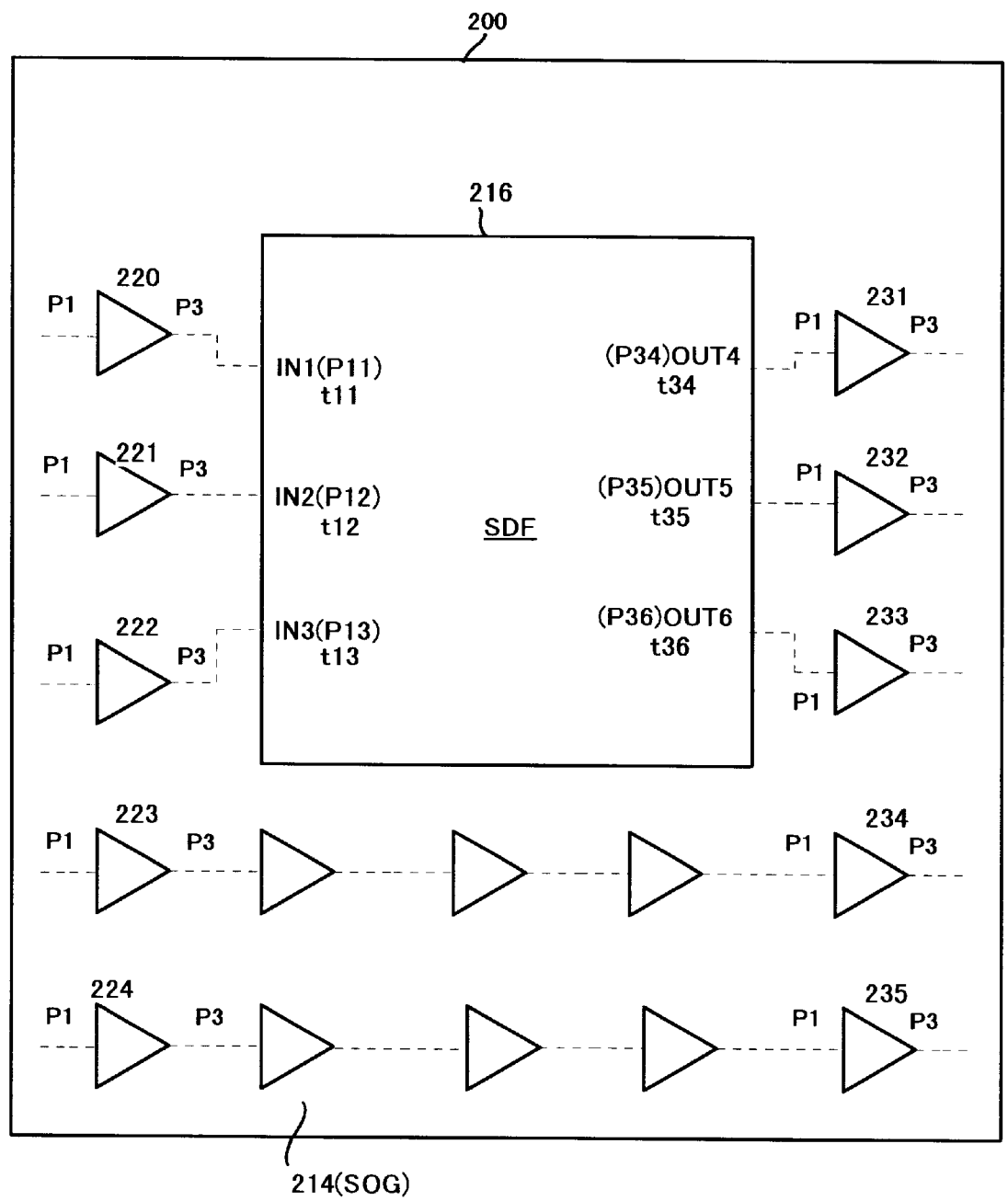
FIG. 11 shows a logic circuit in a chip, where the macro 16 is treated as a cell.

The input terminal delay parameters for the input-side cells 161–163 derived in this way are supplied as delay parameters for the input terminals IN1–IN3 of the macro 216. Similarly, the delay parameters for the output terminals of the output-side cells 164–166 are supplied as delay parameters for the output terminals OUT4–OUT6. FIG. 11 shows a logic circuit in a chip when the macro 216 is treated as a cell. As described above, the delay parameters P11, P12, P13, P34, P35, P36 are supplied for the input terminals IN1–IN3 and output terminals OUT4–OUT6 of the macro 216, and the contents of the macro 216 are treated. as a black box. The respective delay parameters P1, P3 for the standard cells 220–235 in the gate array 214 are extracted from the logic library. In constructing this logic circuit, the respective values for the input through-rate TSin and load capacitance CL are determined from the net list, and the delay time t1 at the input terminal of each cell and the delay time t3 at the output terminal thereof can be derived by means of a prescribed delay time calculating program.

By merging internal delay time data for the chip with internal delay time data for the macro, it is possible to determine delay time data for the chip as a whole. However, in doing this, it is necessary to supply the delay times at the input terminals IN1–3 of the macro 216 determined above again as the delay times at the input terminals 161a–163a of the cells 161–163 on the input side of the macro 216. Similarly, it is necessary to supply the delay times at the output terminals OUT4–OUT6 of the macro 216 determined above again as the delay times at the output terminals 164b–166b of the cells 164–166 on the output side of the macro 216. In other words, this delay time data is added to the SDF delay time data for the macro 216.

A point to note here is that in the step of generating SDF delay time data for the macro 216, it is necessary to calculate provisionally by setting the input through-rate TSin for the input terminals 161a–163a of the input-side cells 161–163 to zero. Similarly, it is also necessary to set the load capacitance CL relating to the output terminals 164b–166b of the output-side cells 164–166 to zero in making calculations. In other words, the delay time data for the input-side cells 161–163 will be, for example, (0, t2, t3), and the delay time data for the output-side cells 164–166 will be, for example, (t1, t2, 0). As shown in FIG. 16, by minimizing the input through-rate TSin and taking the load capacitance CL as zero, the minimum delay time intrinsic to the cell is obtained. Furthermore, the shortest output through-rate TSout obtainable for the cell is given.

By so doing, even if the delay times t11, t12, t13, t34, t35, t36 determined respectively at the input terminals and output terminals of the macro 16 by calculating the delay time for the whole chip are provided as the delay times for the input terminals 161a–163a and output terminals 164b–166b of the corresponding cells, it is possible to avoid duplication of delay times. In other words, the delay time data for cells 161–166 will be, for example:

Cell 161=(t11, t2, t3) Cell 162=(t12, t2, t3) Cell 163=(t13, t2, t3) Cell 164=(t1, t2, t34) Cell 165=(t1, t2, t35) Cell 166=(t1, t2, t36)

Figure 12:
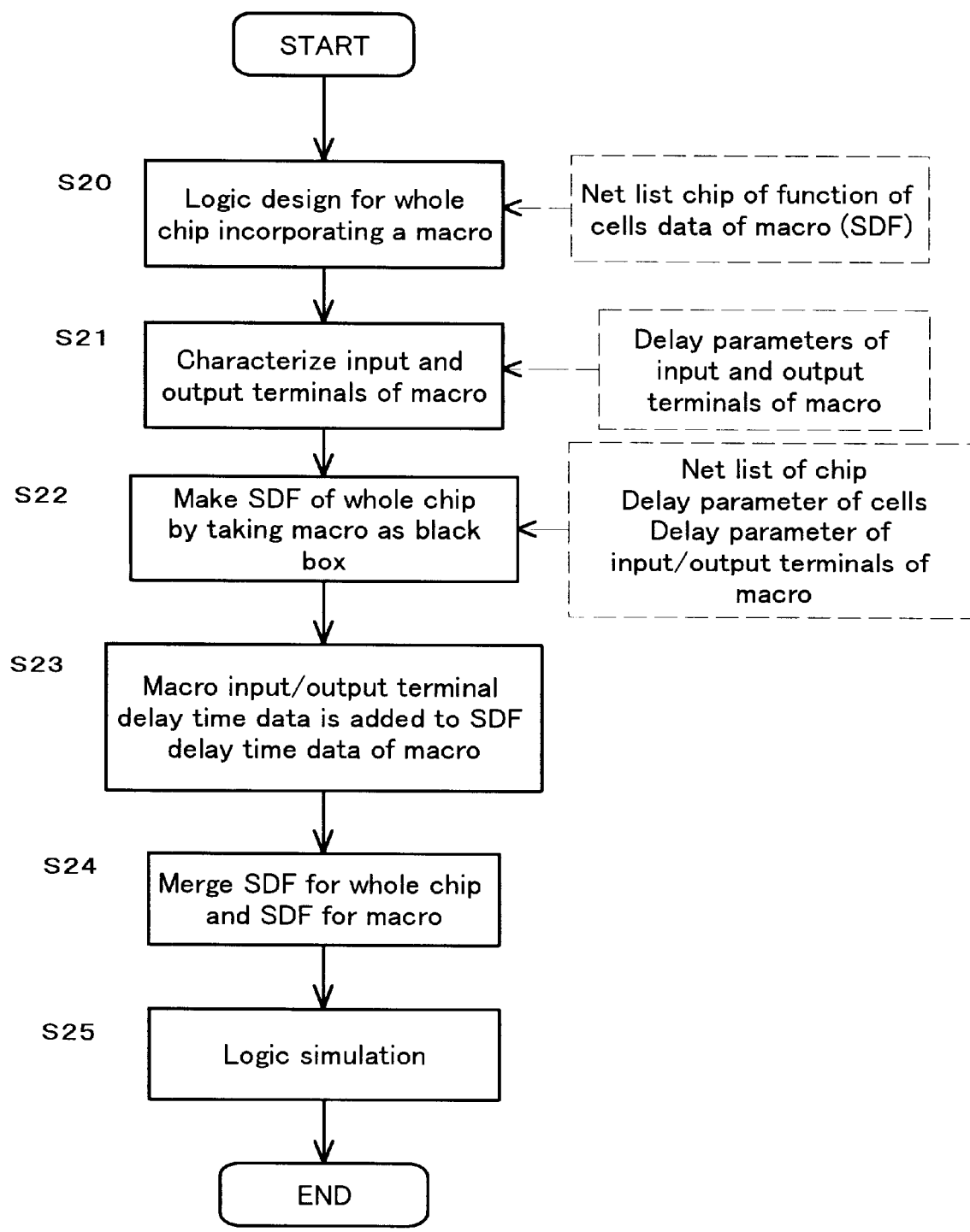
FIG. 12 is a flowchart illustrating steps up to logic simulation for a logic circuit in a chip containing a macro.

As described above, FIG. 12 is a flow-chart showing steps up to logic simulation for a logic circuit in a chip containing a macro. Namely, it is a flowchart for step S10 to step S12 in FIG. 1. Alternatively, it is a flowchart for step S14 and step S15 in FIG. 1.

Firstly, logic design for the whole chip incorporating a macro is carried out (S20). As a result, a net list for the logic circuit in the chip is created. The logic functions and delay parameters, etc. for the standard cells 220–235 are previously recorded in a logic library. The data for the macro 216 is supplied with the macro. This data contains SDF delay time data and the like, as illustrated in FIG. 10. Desirably, the delay time data is determined by taking the input through-rate at the input terminals of the cells on the input side as zero (or a minimum). Furthermore, desirably, the delay time data is determined by taking the load capacitance at the output terminals of the cells on the output side as zero.

Next, the input and output terminals are characterized to the minimum extent necessary in order that the macro 216 can be treated similarly to a standard cell (S21). Specifically, the delay parameter P1 relating to input through-rate dependence at the input terminal IN, and the delay parameter P3 relating to load capacitance CL dependence at the output terminal OUT are determined. The characterizing step is carried out by finding the delay parameters for the input terminals of the internal cells 161–162 connected to the input terminals using the 'Spice' simulator, and similarly finding the delay parameters for the output terminals of the internal cells 164–166 connected to the output terminals using the 'Spice' simulator.

Thereupon, by taking the internal structure of the macro 216 as a black box, supplying the delay parameters P1, P3 determined at the input and output terminals, and treating the macro 216 similarly to other standard cells, the delay time inside the logic circuit of the whole chip is calculated (S22). This produces delay time data in SDF format. This delay time is calculated using the logic circuit net list for the whole chip, the recorded delay parameters for the standard cells, and the input and output terminal delay parameters for the macro 216, and the like.

Next, at step S23, the macro input/output terminal delay time data determined at step S22 is added to the SDF delay time data for the macro 216 as the delay times for the input terminals of the internal cells 161–163 on the input side and the delay times for the output terminals of the internal cells 164–166 on the output side. The SDF delay time data for the whole chip and the SDF delay time data for the macro are then merged (S24).

Thereupon, a logic simulation is carried out using the net list for the whole chip, the logic functions of the standard cells, the macro internal net list, the internal cell logic functions, and the aforementioned merged delay time data (S25). This logic simulation is conducted using a simulation program, such as Verilog-XLL (trade name of Cadence Co. Ltd.), for example.

At step S24, the delay time data for the buried macro and the SDF delay time data for the standard cell logic circuit in the chip are merged. However, cases where the design process for the macro supplied by a third party has been completed, and cases where it has not been completed, can both be imagined. In particular, if the design process for a portion of the macro has not yet been completed, then the delay time data for the macro cannot be supplied until the macro design process is completed.

In this case, if the logic simulation process for the whole chip is put on hold until all the macro delay time data has been supplied, then ultimately it will cause the manufacturing process as a whole to take a long time. Therefore, if the macro delay time data is determined, and the actual lay-out has been completed, then delay time data derived according to this actual lay-out can be used, but for macros where the actual lay-out has not been completed, delay time data derived according to hypothetical wiring is used. Accordingly, the macro design process and the whole chip design process can be carried out in parallel, thereby shortening the manufacturing sequence.

Furthermore, if the SDF delay time data for a plurality of macros buried in a chip is derived at a certain stipulated power source voltage, then it may occur that a power source voltage different to this is supplied to the macro when it is in a buried state in the chip. In cases of this kind, the delay time data at the power source voltage in the chip can be derived by multiplying the delay time data obtained using the stipulated power source by a coefficient which corresponds to the power source voltage ratio. Apart from the power source voltage, if the frequency etc. of the internal clock is different, then desirably, the SDF time delay data supplied with the macro should be corrected similarly.

Figure 13:
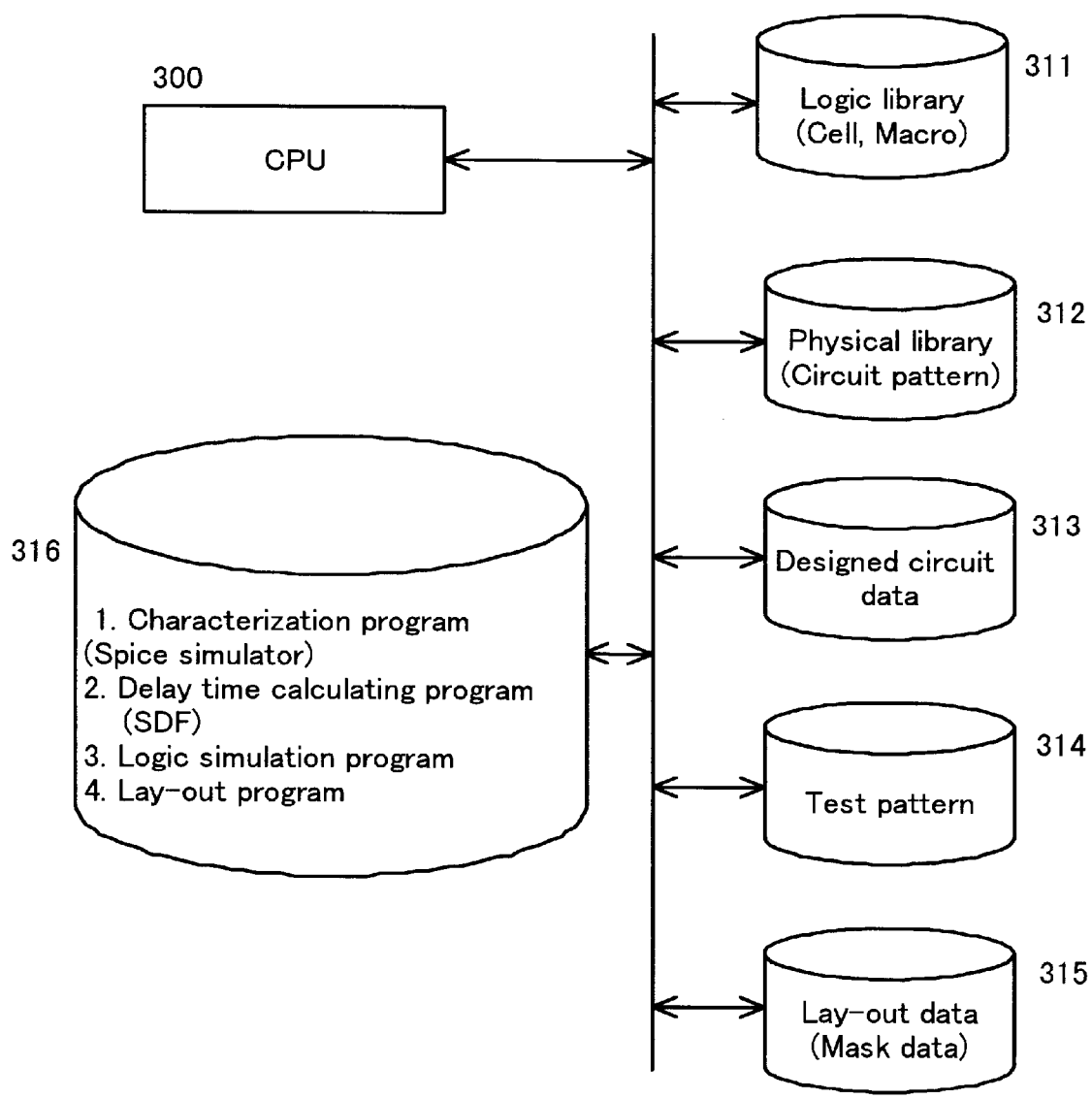
FIG. 13 is a general view of the composition of an LSI design system.

FIG. 13 is a general view of the composition of an LSI design system. This design system is used to implement the steps in FIG. 12. Alternatively, it is used to implement steps S10 to S15 in FIG. 1.

In this system, a CPU 10 is connected to a file 311 storing a logic library, a file 312 storing a physical library, a file 313 storing designed circuit data, a file 314 storing test patterns, and a file 315 storing lay-out data. Furthermore, design tools, such as 'Spice' simulator programs. for characterization, delay time calculating programs, logic simulation programs, lay-out programs, and the like, are stored in a file 316.

The logic library 311 contains the logic functions of standard cells and macro cells, delay parameters, and attribute data, such as terminal capacitance, and the like. The physical library 312 contains circuit patterns for each cell. If a logic circuit is designed using the cells recorded in the logic library, then circuit data, such as the designed net list, etc. is stored in the file 313. The test patterns 315 comprise patterns of input data used in logic simulations, and the corresponding output data, and the like.

Using the lay-out data comprising mask data, the actual circuit lay-out in a chip can be designed.

As described above, according to the present invention, in an ASIC such as a gate array containing a macro supplied by a third party and based on different design rules, it is possible to conduct a logic simulation involving a small number of steps, by using SDF delay time data for the macro.

Second Invention

Figure 14:
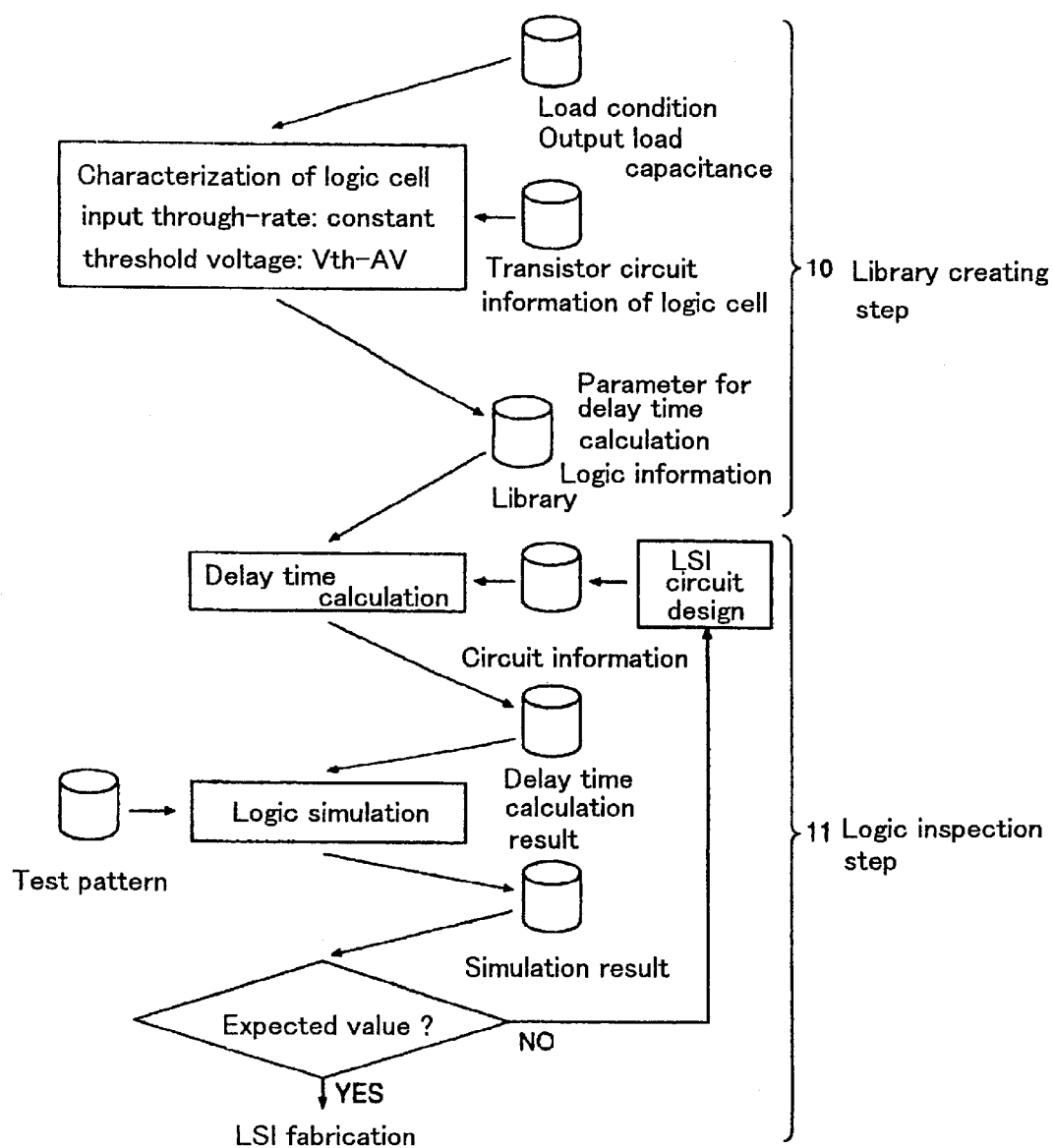
FIG. 14 is a flowchart giving an approximate illustration of a conventional method for LSI circuit logic inspection.

FIG. 14 is a flowchart giving an approximate illustration of a conventional logic inspection (or verification) method for LSI circuits: 10 is a library creating step, which forms a preparatory step; and 11 is a logic inspection step.

In other words, in a conventional library creating step 10, the input through-rate for the input signal to each logic cell is set to a constant, the circuit threshold voltage for each logic cell is set to an average circuit threshold voltage Vth-AV, and only the output load capacitance is variable as a load condition, the characteristics of each logic cell being gathered on the basis of transistor circuit information for each logic cell, and the logic cell characteristics gathered in this way being recorded, as parameters for calculating LSI circuit delay times, in a file called a library, along with the logic information.

In the logic inspection step 11, the LSI circuit delay time is calculated by means of a delay time calculating program, which calculates the delay time for a LSI circuit for which circuit information is provided by referring to a library wherein parameters for calculating delay time are recorded.

Here, the delay time calculation results according to a delay time calculating program are transferred to a logic simulator, which conducts a logic simulation based on these delay time calculation results, using a prescribed test pattern as an input pattern.

Thereupon, it is judged whether or not the expected values have been received in the logic simulation results, and if the expected values have been obtained, fabrication based on the logic inspected LSI circuit is carried out, and if the expected values have not been obtained, the LSI circuit is corrected and delay time calculation and logic simulation are repeated, until the expected values are produced.

Figure 15:
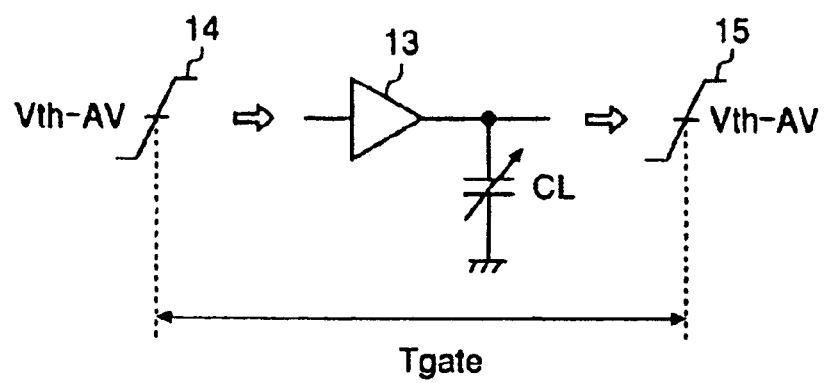
FIG. 15 is a diagram showing a simulation circuit for gathering logic cell characteristics as implemented in a conventional method for LSI circuit logic inspection.

FIG. 15 shows a simulation circuit for gathering the characteristics of logic cells which have been subjected to a conventional LSI circuit logic inspection method; in the diagram, 13 is a logic cell, which is the subject of the characteristics gathering process (characterization process); CL is the output load capacitance of the logic cell 13; 14 is an input signal to the logic cell 13 of average input through-rate; and 15 is an output signal of the logic cell 13, namely, an input signal for the logic cell in the next circuit stage, which has the same input through-rate as the input signal 14.

In other words, conventionally, the input through-rate of the input signal 14 input to the logic cell 13 is fixed to an average value, the circuit threshold voltage of the logic cell 13 is set to an average circuit threshold voltage Vth-AV. And while only the output load capacitance CL is varied, the time taken from the point that the input signal 14 reaches the average circuit threshold voltage Vth-AV until the output signal 15 reaches the average circuit threshold voltage Vth-AV is measured as the delay time Tgate of the logic cell 13, and the relationship between the output load capacitance CL and the delay time Tgate is gathered as the characteristic of the logic cell 13.

Here, the circuit threshold voltage of the logic cell is the voltage at which the logic cell output starts a low level (hereafter, level L) or high level (hereafter, level H) response to an input signal, and although this circuit threshold voltage differs depending on the logic cell architecture, as stated previously, in the prior art, an average circuit threshold voltage Vth-AV is used as the circuit threshold voltage for each logic cell.

FIG. 16 shows diagrams for describing changes in the delay time and the output through-rate for a logic cell when the input through-rate is taken as a variable element. FIG. 16A shows a simulation circuit for gathering logic cell characteristics where the input through-rate is taken as a variable element.

Figure 17:
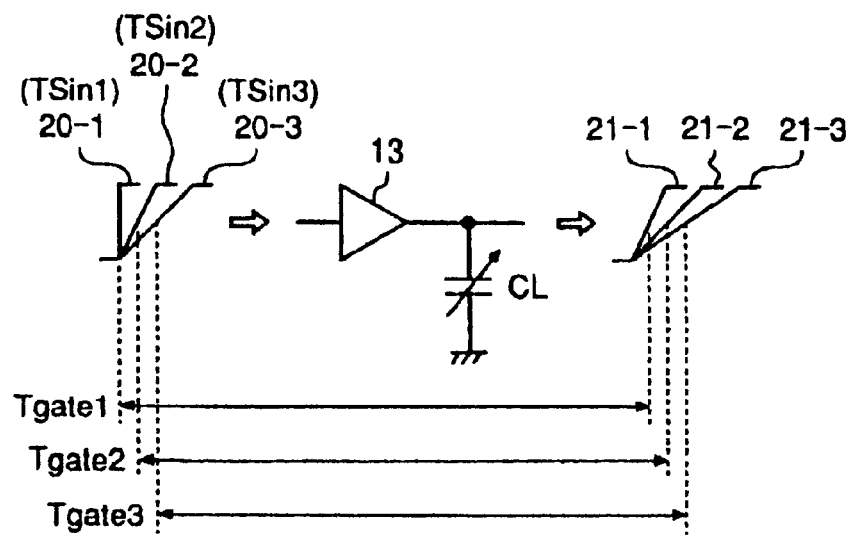
FIG. 17 is a diagram showing a simulation circuit for gathering logic cell characteristics, in a case where the input through-rate is taken as a variable element.

In FIG. 16A, 17-1 is an input signal having an input through-rate of TSin1, 17-2 is an input signal having an input through-rate of TSin2 (>TSin1), 17-3 is an input signal having an input through-rate of TSin3 (>TSin2), and 18 is an output signal of the logic cell 13.

FIG. 16B illustrates the relationship between output load capacitance CL and the delay time Tgate of a logic cell 13 when a circuit simulation is carried out for the simulation circuit shown in FIG. 16A. It shows that as the input through-rate increases, the delay time Tgate of the logic cell 13 also increases. The parameters in FIG. 16B are set on the premise that the logic cell 13 has a certain threshold voltage Vth.

FIG. 16C illustrates the relationship between output load capacitance CL and the output through-rate TSout of the output signal 18 when a circuit simulation is carried out for the simulation circuit shown in FIG. 16A. It shows that as the input through-rate increases, the output through-rate TSout of the output signal 18 also increases.

In this way, when the input through-rate changes, the delay time Tgate and the output through-rate of the logic cell 13 are affected, but in the prior art, it has been possible to ignore the effects of the input through-rate, because logic cell operation is not particularly fast and the logic cell delay time is large.

However, logic cells have come to operate at higher speeds in recent years, and if a highly accurate logic simulation is to be conducted in a designed LSI circuit, it is no longer possible to ignore the effect of the input through-rate on the delay time and output through-rate of a logic cell. Therefore in the step of creating a library for calculating delay time in an LSI circuit, the characteristics of each logic cell need to be gathered, taking the input through-rate as a variable element.

FIG. 17 shows a simulation circuit for gathering logic cell characteristics in a case where the input through-rate is taken as a variable element. In FIG. 17, 20-1 is an input signal having an input through-rate of TSin1, 20-2 is an input signal having an input through-rate of TSin2, and 20-3 is an input signal having an input through-rate of TSin3.

Furthermore, 21-1 is an output signal corresponding to input signal 20-1 having an input through-rate of TSin1, 21-2 is an output signal corresponding to input signal 20-2 having an input through-rate of TSin2, and 21-3 is an output signal corresponding to input signal 20-3 having an input through-rate of TSin3.

In other words, in the characterization process for gathering logic cell characteristics where the input through-rate is taken as a variable element, for a plurality of input signals 20-1, 20-2, 20-3 of differing input through-rate, the output load capacitance CL is varied, the average circuit threshold voltage Vth-AV for the logic cell is taken as the delay time judgement level, and the delay times Tgate1, Tgate2, Tgate3 for the logic cell 13 corresponding to the input signals 20-1, 20-2, 20-3 can be measured by means of a circuit simulator.

However, if the input through-rate is treated as a variable element and the circuit threshold voltage for each logic cell is taken as an average circuit threshold voltage Vth-AV, then in some cases the delay time may have a negative value, depending on the logic cell. In general logic simulators, a negative delay time is treated as a delay time of zero, and hence in such cases, it has not been possible to carry out a highly accurate logic simulation.

Figure 18:
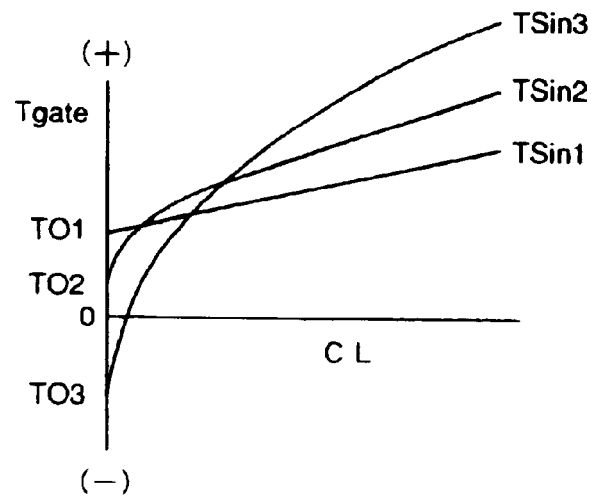
FIG. 18 is a diagram illustrating the relationship between output load capacitance CL and delay time Tgate, for a logic cell having a circuit threshold voltage which is lower or higher than the average circuit threshold voltage.

Usually, the circuit threshold voltage of a logic cell varies depending on the logic cell structure, e.g. if it is a NAND circuit or NOR circuit, etc., and there are logic cells which have a circuit threshold voltage higher or lower than the average circuit threshold voltage Vth-AV. If a circuit simulation is conducted as shown in FIG. 17 for logic cells of this kind, the relationship between the output load capacitance CL and the delay time Tgate will be as illustrated in FIG. 18, and if the input through-rate is large (TSin3) or the output load capacitance CL is small, then the delay time will be judged to have a negative value. In other words., if the delay parameters in FIG. 16B are set at the average threshold voltage Vth-AV, then at an extremely slow input through-rate TSin3 and load capacitance CL=0, the delay time Tgate will be given a negative value.

Figure 19:
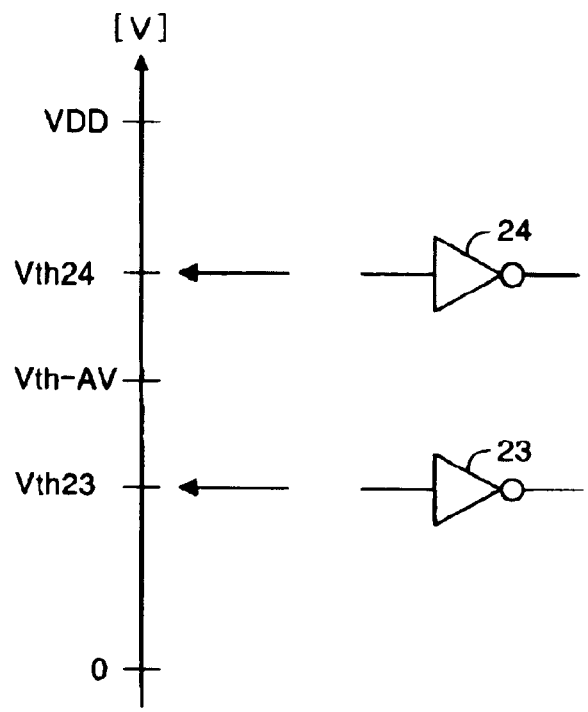
FIG. 19 is a diagram for describing the mechanism involved when the delay time for a logic cell having a circuit threshold voltage lower or higher than the average circuit threshold voltage takes a negative value.

FIG. 19 is a diagram for describing the mechanism involved when the delay time for a logic cell having a circuit a threshold voltage lower or higher than the average circuit threshold voltage Vth-AV assumes a negative value: logic cell 23 has a circuit threshold voltage Vth23 lower than the average circuit threshold voltage Vth-AV; and logic cell 24 has a circuit threshold voltage Vth24 higher than the average circuit threshold voltage Vth-AV. VDD is the power source voltage.

Figure 20A:
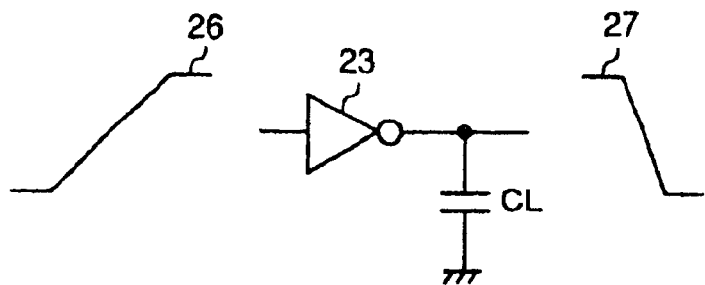
FIGS. 20A–20B show diagrams for describing the mechanism involved when the delay time for a logic cell having a circuit threshold voltage lower than the average circuit threshold voltage takes a negative value.

FIG. 20 shows diagrams for describing the mechanism involved when the delay time Tgate23 of the logic cell 23 takes a negative value: FIG. 20A is a simulation circuit for measuring the output signal response to input signals to logic cell 23, where 26 is an input signal and 27 is an output signal.

Figure 20B:
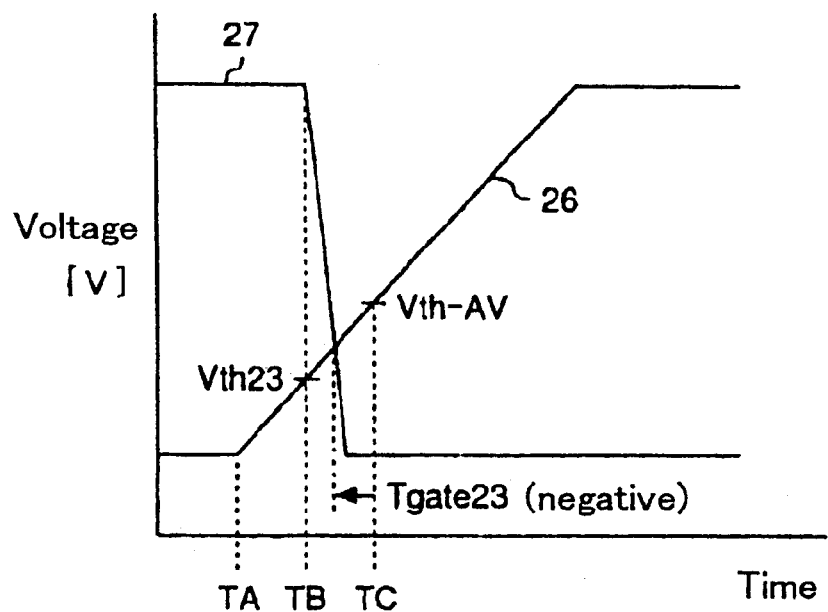

FIG. 20B illustrates the response characteristics of the output signal 27 with respect to the input signal 26 to the logic cell 23 in the simulation circuit shown in FIG. 20A, where the through-rate of the input signal 26 is large and the output load capacitance CL is small. The response characteristics relating to the input signal 26 and output signal 27 in FIG. 20B can be generated by means of the parameters shown in FIG. 16.

FIG. 20B shows a case where the input signal 26 starts to rise at timing TA, but if the input through-rate for the input signal 26 is large, the input signal 26 will rise gradually.

At timing TB, when the voltage level of the input signal 26 reaches the circuit threshold voltage Vth23 of the logic cell 23, the output signal 27 starts to fall, and since the output load capacitance CL of the logic cell 23 is low, the output signal 27 demonstrates extremely fast response characteristics.

Consequently, since the output signal 27 falls below the average circuit threshold voltage Vth-AV before the input signal 26 reaches the average circuit threshold voltage Vth-AV, which is the voltage for measuring the delay time Tgate23 of the logic cell 23, the delay time Tgate23 for the logic cell 23 will have a negative value if it is measured with reference to timing TC at which the input signal 26 reaches the average circuit threshold voltage Vth-AV.

Furthermore, when the logic cell has a lower circuit threshold voltage than the average circuit threshold voltage Vth-AV, as with logic cell 23, then if the input signal has a falling waveform, the output signal will not reach the circuit threshold voltage of the logic cell, even if the input waveform reaches the average circuit threshold voltage Vth-AV, and therefore the delay time will not have a negative value.

Figure 21A:
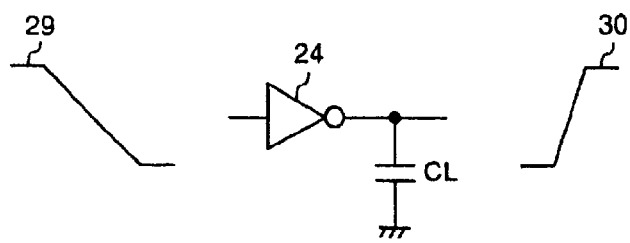
FIGS. 21A–21B show diagrams for describing the mechanism involved when the delay time for a logic cell having a circuit threshold voltage higher than the average circuit threshold voltage takes a negative value.

FIG. 21 shows diagrams for describing the mechanism involved when the delay time Tgate24 for logic cell 24 takes a negative value. FIG. 21A is a simulation circuit for measuring the output signal response to input signals to logic cell 24, where 29 is an input signal and 30 is an output signal.

Figure 21B:
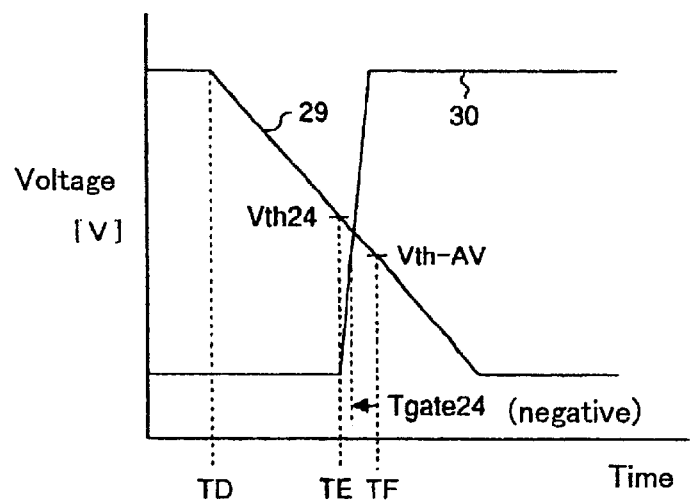

FIG. 21B shows the response characteristics of the output signal 30 with respect to the input signal 29 to logic cell 24 in the simulation circuit shown in FIG. 21A, in a case where the through-rate of the input signal 29 is large and the output load capacitance CL is small. The response characteristics in FIG. 21B are generated by means of the parameters in FIG. 16.

FIG. 21B shows a case where the input signal 29 starts to fall at timing TD, but when the input through-rate of the input signal 29 is large, the input signal 29 falls gradually.

At timing TE, when the voltage level of the input signal 29 reaches the circuit threshold voltage Vth24 of logic cell 24, the output signal 30 starts to rise, and since the output load capacitance CL of the logic cell 24 is low, the output signal 30 demonstrates extremely fast response characteristics.

Consequently, since the output signal 30 rises above the average circuit threshold voltage Vth-AV before the input signal 29 reaches the average circuit threshold voltage Vth-AV, which is the voltage for measuring the delay time Tgate 24 of the logic cell 24, the delay time Tgate24 for the logic cell 24 will take a negative value if it is measured with reference to timing TF at which the input signal 29 reaches the average circuit threshold voltage Vth-AV.

When the logic cell has a higher circuit threshold voltage than the average circuit threshold voltage Vth-AV, as with logic cell 24, then if the input signal has a rising waveform, the output signal will not reach the circuit threshold voltage of the logic cell, even if the input waveform reaches the average circuit threshold voltage Vth-AV, and therefore the delay time will not take a negative value.

In this way, if the input through-rate is treated as a variable element and the delay time for each logic cell is measured taking the circuit threshold voltage of each logic cell as the average circuit threshold voltage Vth-AV, then the delay time may take a negative value, depending on the logic cell. In such cases, general logic simulators take the delay time as zero, and therefore a highly accurate logic simulation cannot be conducted.

In order to solve the aforementioned problems, a method may be conceived, wherein, for example, the logic cell circuit threshold voltage is measured for each logic cell, and the delay time for each logic cell is measured using these results.

However, in this case, since there exist several hundred different types of logic cells, for which the circuit threshold voltage would need to be measured respectively, this method would require a great deal of time. And moreover, when the LSI circuit delay time is calculated, since the delay time sampling points for each logic cell are different, a correct delay time will not be produced simply by adding up the delay times for each logic cell, so judgement level combination processing for measuring the delay time becomes necessary in the delay time calculation program, thereby reducing the processing speed in proportion to the increased complexity of processing.

A first and a second embodiment of the second invention are now described with reference to FIGS. 22–38.

First Embodiment: FIG. 22–FIG. 34

Figure 22:
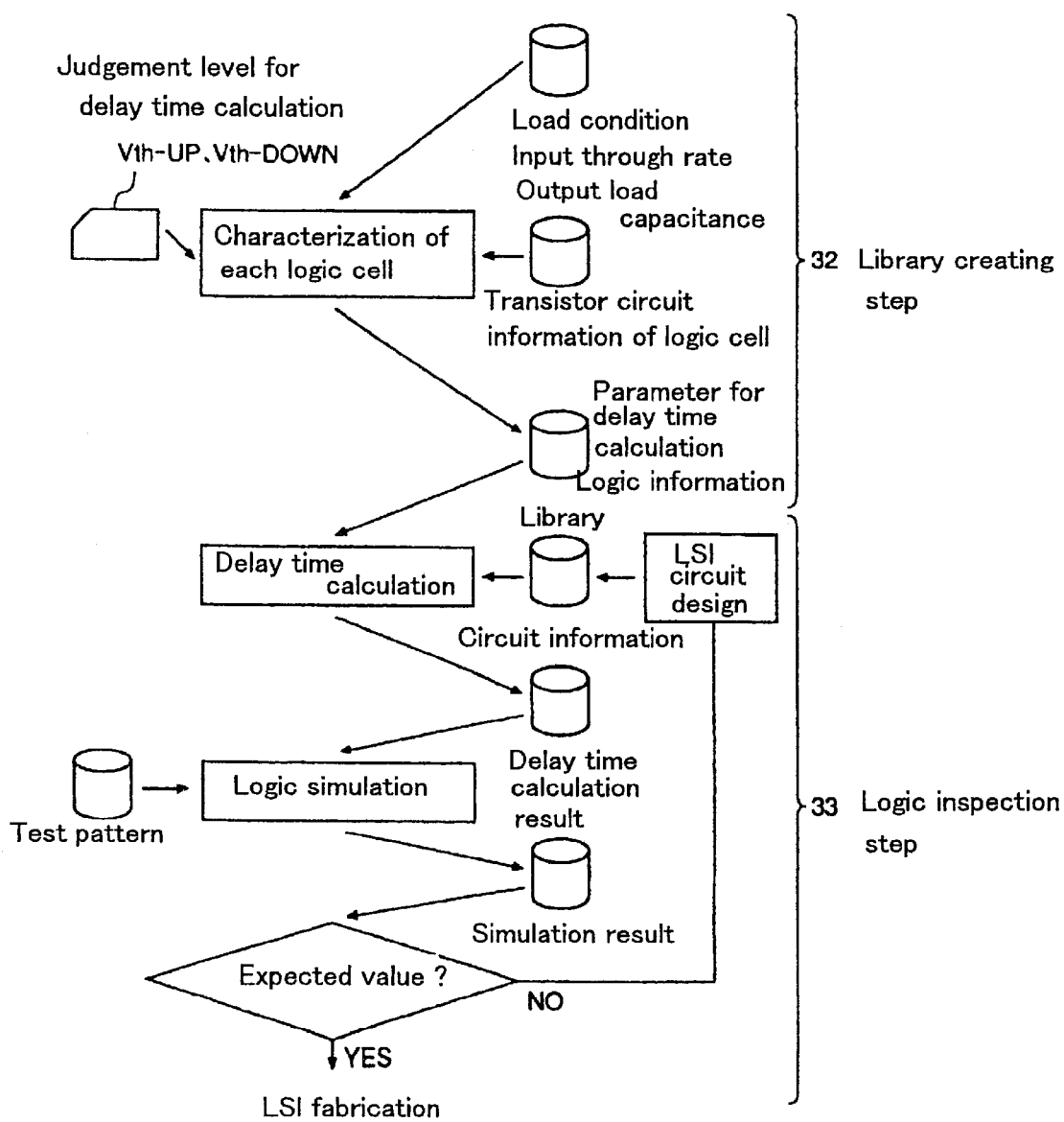
FIG. 22 is a flowchart giving an approximate illustration of a first mode for implementing the present invention.

FIG. 22 is a flowchart giving an approximate illustration of a first embodiment of the present invention. In FIG. 22, 32 is a library creating step, which is a preparatory step, and 33 is a logic inspection (verification) step.

Specifically, in the first embodiment of the present invention, the input through-rate and output load capacitance forming the load conditions are taken as variable elements, the circuit threshold voltage for each logic cell is taken as the circuit threshold voltage Vth-UP for a rising waveform, which is described below, when the input signal has a rising waveform, and it is taken as the circuit threshold voltage Vth-DOWN for a falling waveform, also described below, when the input signal has a falling waveform, and a characterizing step for gathering the characteristics of each logic cell is carried out on the basis of the logic cell transistor circuit information. The characteristics for each logic cell gathered in this way are recorded as parameters for calculating LSI circuit delay time in a file called a library, along with the logic information. In other words, the delay parameters shown in FIG. 16B are set on the premise that the circuit threshold voltage of the logic cell is Vth-UP or Vth-DOWN.

Figure 23:
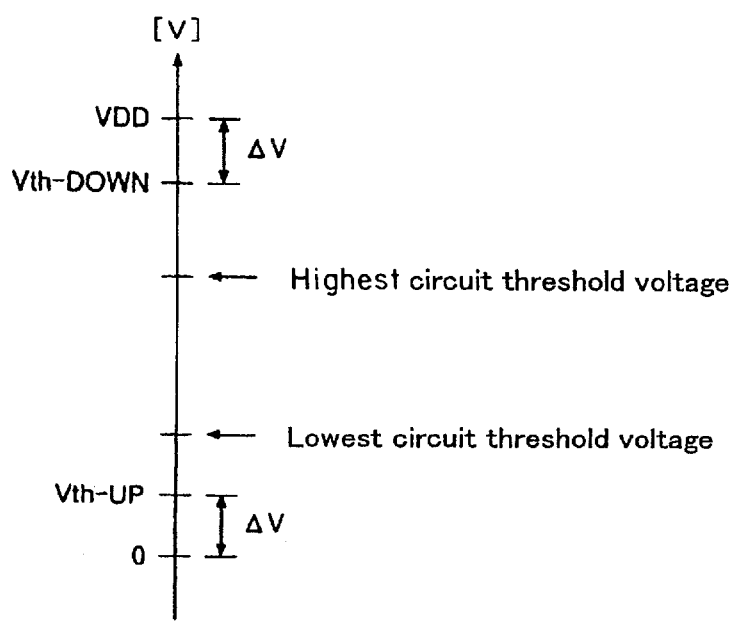
FIG. 23 is a diagram for describing a method of determining a rising waveform circuit threshold voltage and a falling waveform circuit threshold voltage implemented in the first mode for implementing the present invention.

FIG. 23 is a diagram for describing a method of determining a rising waveform circuit threshold voltage Vth-UP and a falling waveform circuit threshold voltage Vth-DOWN, as implemented in the first embodiment of the present invention.

In the first embodiment of the present invention, the rising waveform circuit threshold voltage Vth-UP is a voltage lower than the circuit threshold voltage of the logic cell having the lowest circuit threshold voltage of all the logic cells, and the falling waveform circuit threshold voltage Vth-DOWN is a voltage higher than the circuit threshold voltage of the logic cell having the highest circuit threshold voltage of all the logic cells. Furthermore, the voltages are determined such that the following equation is satisfied: input waveform level H (e.g., power source voltage VDD)−[falling waveform circuit threshold voltage Vth-DOWN]=[rising waveform circuit threshold voltage Vth-UP]−input waveform level L (e.g., 0 [V])=$\Delta$V.

Figure 24:
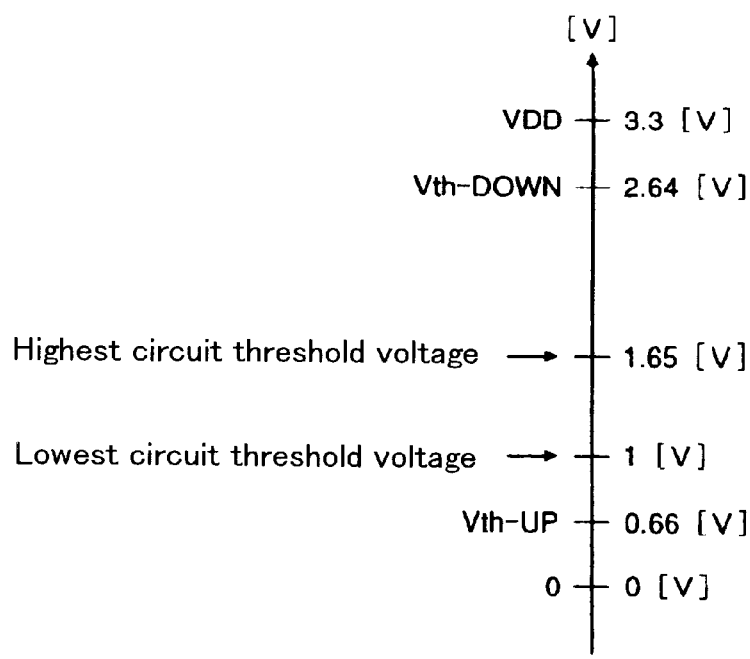
FIG. 24 is a diagram illustrating a specific example of a rising waveform circuit threshold voltage and falling waveform circuit threshold voltage.

For example, as shown in FIG. 24, if the power source voltage VDD=3.3 (V), the circuit threshold voltage of the logic cell having the highest circuit threshold voltage=1.65 (V), and the circuit threshold voltage of the logic cell having the lowest circuit threshold voltage=1 (V), then, for example, the falling waveform circuit threshold voltage Vth-DOWN=3.3 (V)×80%=2.64 (V), and the rising waveform circuit threshold voltage Vth-UP=3.3 (V)×20%=0.66 (V).

Here, the circuit threshold voltage of the logic cell having the highest circuit threshold voltage and the circuit threshold voltage of the logic cell having the lowest circuit threshold voltage can be determined by searching in the transistor structure for the logic cells having the highest and lowest circuit threshold voltages, respectively, and measuring the DC characteristics and AC characteristics for these cells.

Figure 25A:
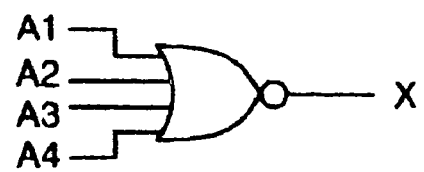
FIGS. 25A–25B show diagrams illustrating a four-input NOR circuit having a CMOS structure.
Figure 25B:
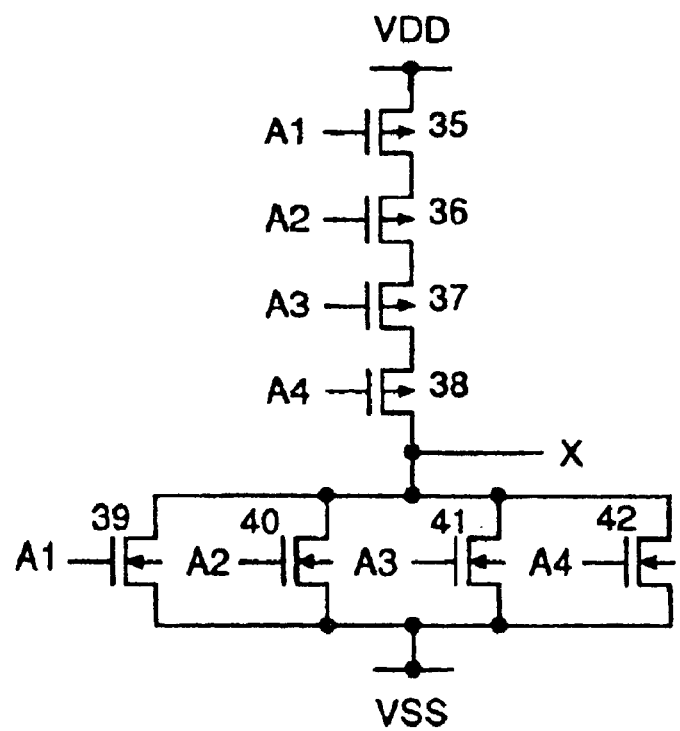

For example, FIG. 25 shows a 4-input NOR circuit having a CMOS structure: FIG. 25A is a symbol diagram; and FIG. 25B is a transistor circuit diagram. A1–A4 are input signals, 35–38 are PMOS transistors, 39–42 are nMOS transistors, and X is an output signal.

The four-input NOR circuit comprises the four pMOS transistors 35–38 connected in a vertical stack, and the four nMOS transistors 39–42 connected in parallel, and therefore the resistance between the VDD power source line and the output terminal differs from the resistance between the output terminal and the VSS power source line.

Here, if the PMOS transistors are in an ON state, then the resistance between the VDD power source line and the output terminal will be four times the resistance of a single pMOS transistor, whereas since the nMOS transistors 39–42 are connected in parallel, then even if one of the nMOS transistors 39–42 is in an ON state and the resistance between the output terminal and the VSS power source line is a maximum, it will still only be equal to the resistance of a single nMOS transistor.

Moreover, since the mobility of the carrier electrons in the nMOS transistors is greater than the mobility of the carrier holes in the pMOS transistors, the nMOS transistors will have a smaller resistance than pMOS transistors of the same size.

Therefore, if input signal A1=input signal A2=input signal A3=input signal A4="0", then the output signal X will take level H, and if at least one of the input signals A1–A4 is "1", then the output signal X will take level L. However, since transistors have a varying ON resistance, depending on the size of the gate voltage, then if the pMOS transistors are activated and the output signal X takes level H, the gate voltage for the pMOS transistors 35–38 will need to be closer to the VSS level.

Conversely, if a portion or all of the nMOS transistors 39–42 are activated and the output signal X assumes level L, the output signal X can still take level L even if the gate voltage for the nMOS transistors 39–42 is not particularly close to the VDD level.

Therefore, in the case of the four-input NOR circuit shown in FIG. 25, the circuit threshold voltage is drawn towards the VSS voltage.

In this way, by knowing the transistor structure of the logic cells, it is possible readily to find the logic cell having the highest circuit threshold voltage and the logic cell having the lowest circuit threshold voltage.

Thereupon, the circuit threshold voltages of the logic cell having the highest circuit threshold voltage and the logic cell having the lowest circuit threshold voltage, found as described above, can be derived from DC characteristics or AC characteristics using a circuit simulator.

Figure 26A:
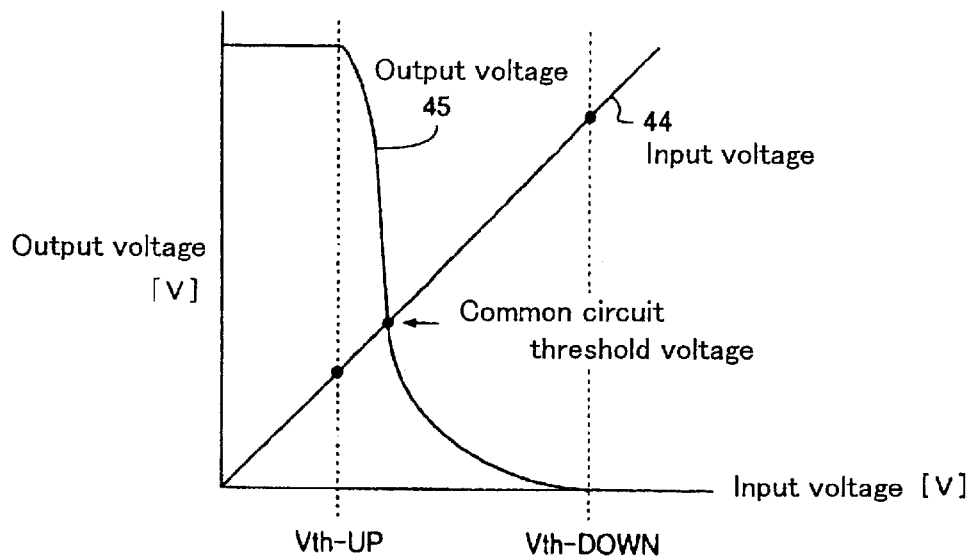
FIGS. 26A–26B show diagrams for describing a method of determining a rising waveform circuit threshold voltage Vth-UP and falling waveform circuit threshold voltage Vth-DOWN from DC characteristics.

Here, if the rising waveform circuit threshold voltage Vth-up is measured from DC characteristics, then as shown in FIG. 26A, the input voltage 44 gradually rises, and the input voltage at the time that the output voltage 45 starts to fall is taken as the rising waveform circuit threshold voltage Vth-UP.

Furthermore, if the falling waveform circuit threshold voltage Vth-DOWN is measured from DC characteristics, then similarly, as shown in FIG. 26A, the input voltage 44 gradually rises, and the input voltage at the time that the output voltage 45 stops falling is taken as the falling waveform circuit threshold voltage Vth-DOWN.

Figure 26B:
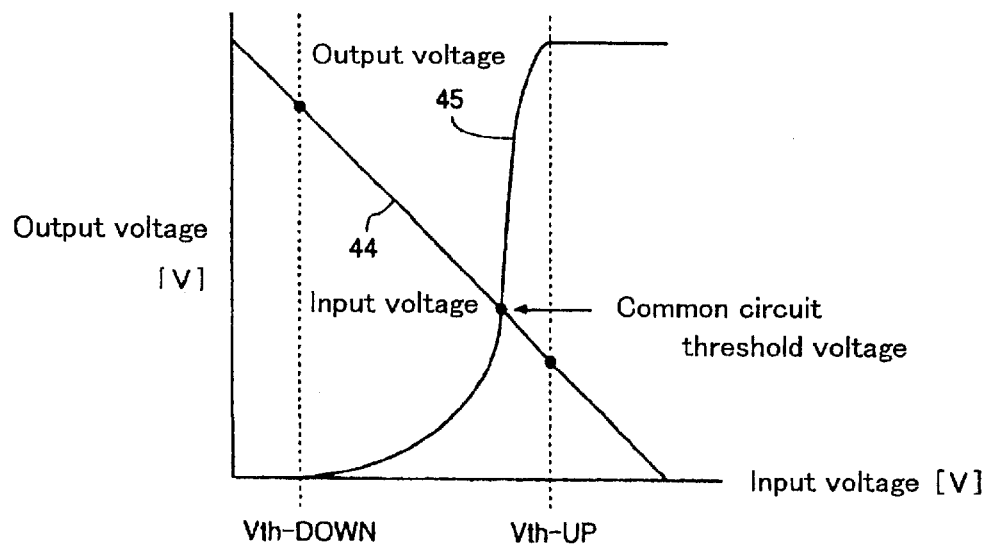

Alternatively, while the input voltage 44 gradually falls, as shown in FIG. 26B, then the input voltage at the time that the output voltage 45 starts to rise is taken as the falling waveform circuit threshold voltage Vth-DOWN, and the input voltage at the time that the output voltage 45 stops falling is taken as the rising waveform circuit threshold voltage Vth-UP.

Generally, the circuit threshold voltage is described as the voltage of the input signal 44 when the input signal 44 and output signal 45 cross, but in the first embodiment of the second invention, the output judgement level is shifted by combining it with the input judgement level, and therefore the voltage of the input signal 44 at the time that the voltage of the output signal 45 starts to change is taken as the circuit threshold voltage, without any negative values being produced.

Figure 27A:
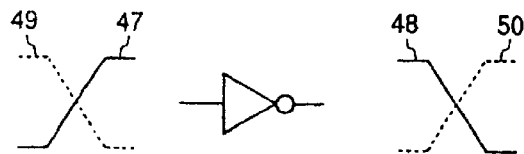
FIGS. 27A–27C show diagrams for describing a method of determining a rising waveform circuit threshold voltage and falling waveform circuit threshold voltage from AC characteristics.
Figure 27B:
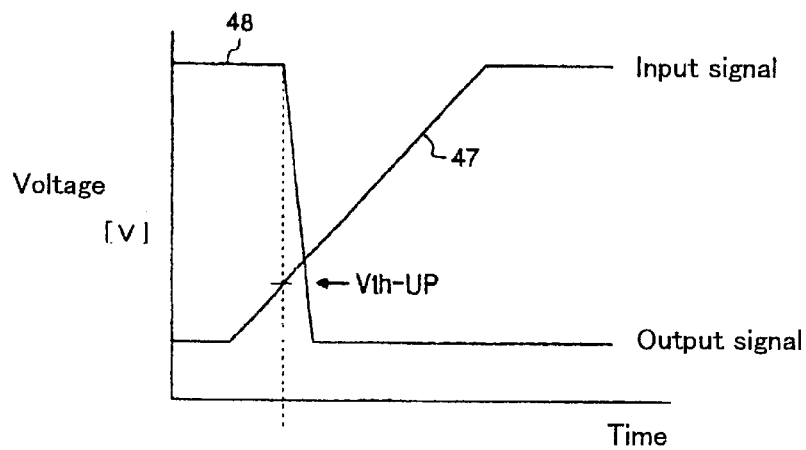
Figure 27C:
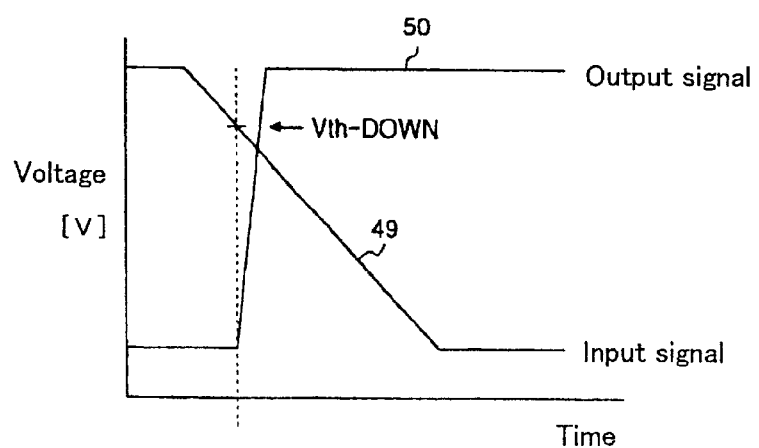

FIG. 27 shows diagrams for describing a method for measuring the rising waveform circuit threshold voltage Vth-UP and the falling waveform circuit threshold voltage Vth-DOWN from AC characteristics. FIG. 27A is a simulation circuit and FIG. 27B and 27C illustrate changes in the input signal and output signal.

When the rising waveform circuit threshold voltage Vth-UP is measured from AC characteristics, then if a rising waveform input signal 47 having the maximum input through-rate allowed by design rules is input in a loadless state, the voltage of the input signal 47 when the output signal 48 starts to change is taken as the rising waveform circuit threshold voltage Vth-UP.

When the falling waveform circuit threshold voltage Vth-DOWN is measured from AC characteristics, then if a falling waveform input signal 49 having the maximum input throughrate allowed by design rules is input in a loadless state, the voltage of the input signal 49 when the output signal 50 starts to change is taken as the falling waveform circuit threshold voltage Vth-DOWN.

In this way, the logic cell delay times are defined as illustrated in FIG. 28 and FIG. 29, when the rising waveform circuit threshold voltage Vth-UP and falling waveform circuit threshold voltage Vth-DOWN are determined.

Figure 28A:
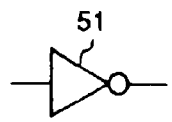
FIGS. 28–28C show diagrams for describing the definition of logic cell delay time in the first mode for implementing the present invention.
Figure 28B:
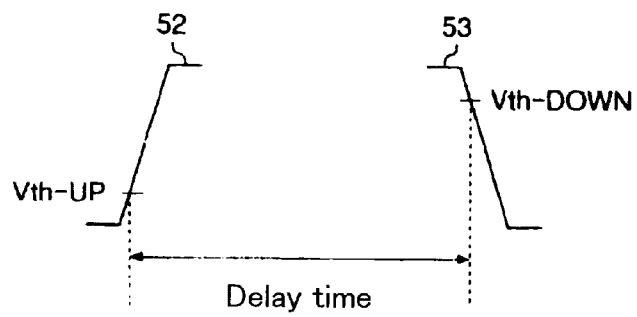

Specifically, as shown in FIG. 28A, the input signal and output signal in logic cell 51 are of inverse polarity, and as shown in FIG. 28B, when the input signal 52 has a rising waveform, the delay time for the logic cell 51 is defined as the time from the point that the input signal 52 rises to the rising waveform circuit threshold voltage Vth-UP until the output signal 53 falls to the falling waveform circuit threshold voltage Vth-DOWN.

Figure 28C:
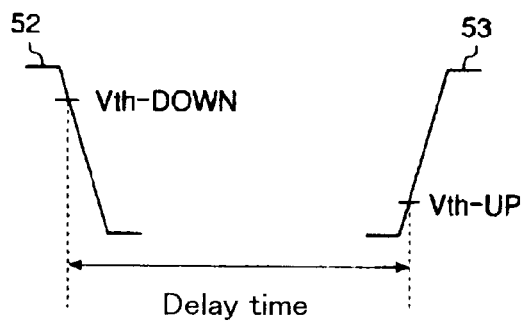

Furthermore, as shown in FIG. 28A, the input signal and output signal in logic cell 51 are of inverse polarity, and as shown in FIG. 28C, when the input signal 52 has a falling waveform, the delay time for the logic cell 51 is defined as the time from the point that the input signal 52 falls to the falling waveform circuit threshold voltage Vth-DOWN until the output signal 53 rises to the rising waveform circuit threshold voltage Vth-UP.

Figure 29A:
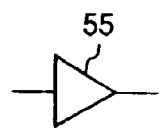
FIGS. 29A–29C show diagrams for describing the definition of logic cell delay time in the first mode for implementing the present invention.
Figure 29B:
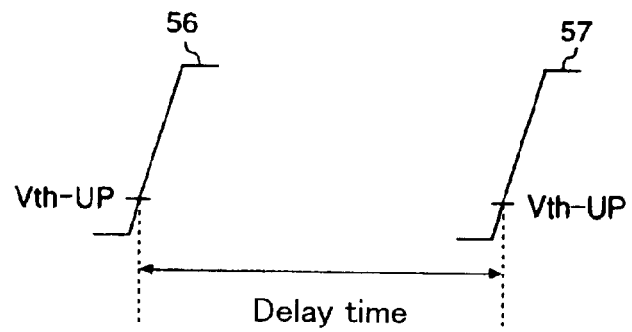

As shown in FIG. 29A, the input signal and output signal of the logic cell 55 are of the same polarity, and as shown in FIG. 29B, when the input signal 56 has a rising waveform, the delay time for the logic cell 55 is defined as the time from the point that the input signal 56 rises to the rising waveform circuit threshold voltage Vth-UP until the output signal 57 rises to the rising waveform circuit threshold voltage Vth-UP.

Figure 29C:
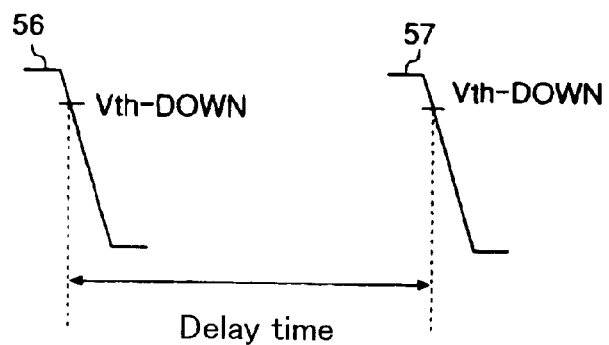

Furthermore, as shown in FIG. 29A, the input signal and output signal of the logic cell 55 are of the same polarity, and as shown in FIG. 29C, if the input signal 56 has a falling waveform, the delay time for the logic cell 55 is defined as the time from the point that the input signal 56 falls to the falling waveform circuit threshold voltage Vth-DOWN until the output signal 57 falls to the falling waveform circuit threshold voltage Vth-DOWN. The delay parameters are set on the basis of these delay time definitions.

In the logic inspection step 33, delay times for an LSI circuit are calculated using a delay time calculating program, which calculates delay times for an LSI circuit for which circuit information is given, by referring to the library wherein parameters for delay time calculation are recorded.

Figure 30:
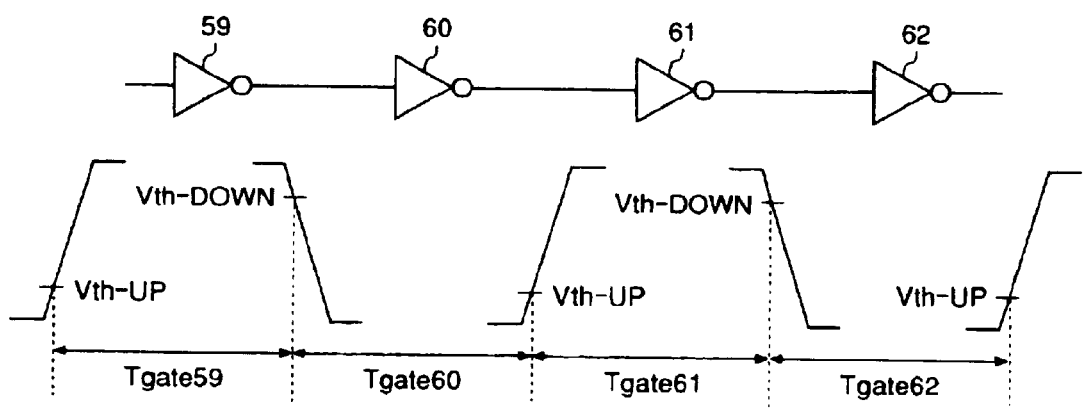
FIG. 30 is a diagram illustrating an image of delay times in a case where logic cells are linked together and the logic cell delay times are defined such that the first mode for implementing the present invention can be applied.
Figure 31:
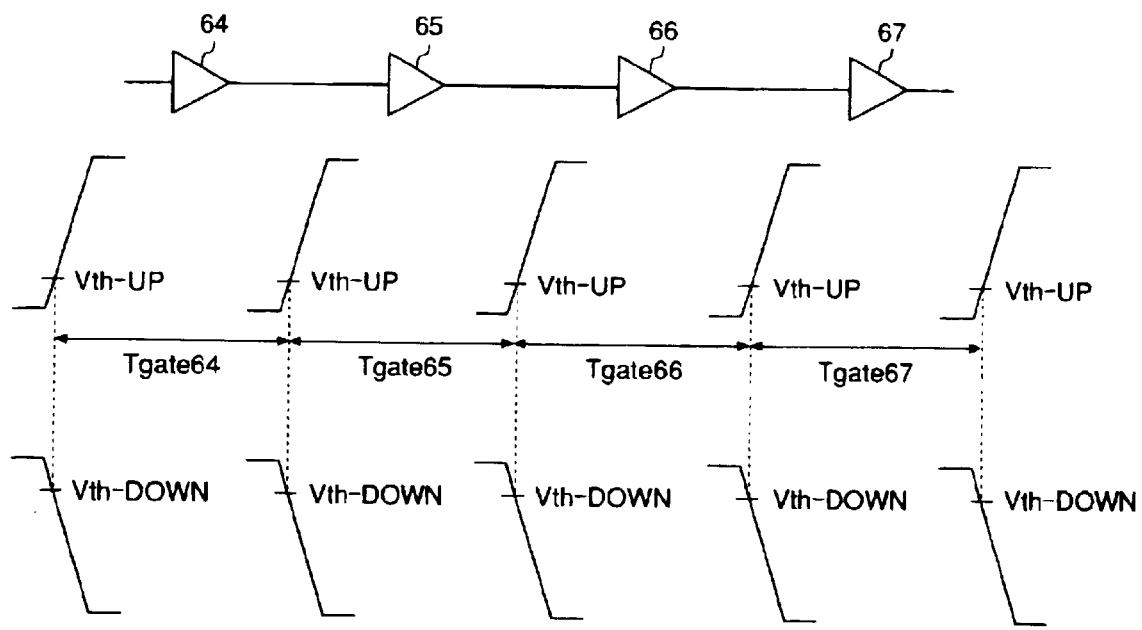
FIG. 31 is a diagram illustrating an image of delay times in a case where logic cells are linked together and the logic cell delay times are defined such that the first mode for implementing the present invention can be applied.

Here, if the logic cell delay time is defined as illustrated in FIG. 28 and FIG. 29, the delay time image when logic cells are connected will be as shown in FIG. 30 and FIG. 31, for example.

In FIG. 30, 59, 60, 61 and 62 are logic cells whose input signal and output signal are of inverse polarity, Tgate59 is the delay time for logic cell 59, Tgate60 is the delay time for logic cell 60, Tgate61 is the delay time for logic cell 61, and Tgate62 is the delay time for logic cell 62.

In FIG. 31, 64, 65, 66, and 67 are logic cells whose input signal and output signal are of the same polarity, Tgate64 is the delay time of logic cell 64, Tgate65 is the delay time of logic cell 65, Tgate66 is the delay time of logic cell 66, and Tgate67 is the delay time of logic cell 67.

Figure 32:
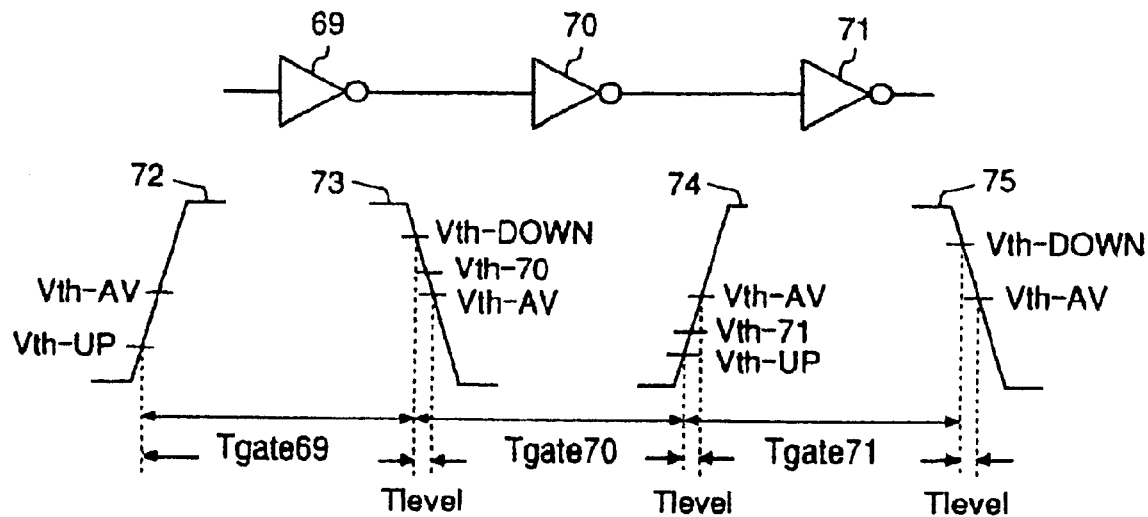
FIG. 32 is a diagram for describing how no negative values are produced for logic cell delay times when the logic cell delay times are defined as illustrated in FIG. 28 and FIG. 29.

FIG. 32 is a diagram for describing how no negative values are generated for the logic cell delay time, when the logic cell delay time is defined as shown in FIG. 28 and FIG. 29.

In FIG. 32, 69, 70 and 71 are logic cells whose input signal and output signal are of inverse polarity, 72 is the input signal to logic cell 69, 73 is the output signal from logic cell 69 (input signal to logic cell 70), 74 is the output signal from logic cell 70 (input signal to logic cell 71), 75 is the output signal from logic cell 71, Tgate69 is the delay time for logic cell 69, Tgate7o is the delay time for logic cell 70, and Tgate71 is the delay time for logic cell 71.

Focusing on the output signal 73 of logic cell 69, since the falling waveform circuit threshold voltage Vth-DOWN for logic cell 70 is higher than the average circuit threshold voltage Vth-AV and the actual circuit threshold voltage Vth-70 of logic cell 70, then no matter how small the output load capacitance of logic cell 70 and no matter how large the output through-rate of the output signal 73 from logic cell 69, the output signal 74 from logic cell 70 will not change at the point that the output signal 73 from logic cell 69 reaches the falling waveform circuit threshold voltage Vth-DOWN, and therefore a negative value will never be produced for the delay time Tgate70 of logic cell 70.

Here, the judgement point in the input signal 73 for the lo delay time Tgate70 of logic cell 70 is shifted by an amount equal to T level (=[falling waveform circuit threshold voltage Vth-DOWN)−] average circuit threshold voltage Vth-AV]), and therefore, this amount must be subtracted elsewhere.

This is possible by shifting the judgement point in the output signal 73 for the delay time Tgate69 of logic cell 69 to the falling waveform circuit threshold voltage Vth-DOWN. This method is used in the first embodiment of the second invention, and the step of shifting the judgement point in the output signal 73 for the delay time Tgate69 of logic cell 69 by an amount equal to T level such that it is at the falling waveform circuit threshold voltage Vth-DOWN is equivalent to subtracting an amount equal to T level from the delay time Tgate69 for logic cell 69.

The output through-rate for the output signal 73 from logic cell 69 becomes extremely high when a very large load is applied to the output of logic cell 69. And when a very large load of this kind is applied to logic cell 69, the delay time Tgate69 for logic cell 69 also becomes large, and hence no negative value is produced for the logic cell 69 delay time, even if the judgement point in the output signal 73 for the delay time Tgate69 for logic cell 69 is shifted by T level and set to the falling waveform circuit threshold voltage Vth-DOWN.

Turning to the output signal 74 from logic cell 70, since the rising waveform circuit threshold voltage Vth-UP for logic cell 71 is lower than the average circuit threshold voltage Vth-AV and the actual circuit threshold voltage Vth-71 of logic cell 71, then no matter how small the output load capacitance of the logic cell 71 and no matter how large the output through-rate of the output signal 74 of the logic cell 70, the output signal 75 from logic cell 71 will not change at the point that the output signal 74 from logic cell 70 reaches the rising waveform circuit threshold voltage Vth-UP, and therefore no negative values are produced for the delay time Tgate71 of logic cell 71.

As described above, in the logic inspection step 33, the LSI circuit delay time is calculated by means of a delay time calculating program and the results therefrom are transferred to a logic simulator, which conducts a logic simulation using a prescribed test pattern, on the basis of the delay time calculated by the delay time calculating program.

It is then judged whether or not the logic simulation produces the expected values, and if these expected values are obtained, fabrication based on the logic inspected LSI circuit is implemented, whereas if the expected values are not obtained, the LSI circuit is corrected and delay time calculation and logic simulation are repeated until the expected values are obtained.

As described above, in the first embodiment of the second invention, the circuit threshold voltage for each logic cell is divided into a rising waveform circuit threshold voltage Vth-UP and a falling waveform circuit threshold voltage Vth-DOWN.

The rising waveform circuit threshold voltage Vth-UP is a voltage lower than the circuit threshold voltage of the logic cell having the lowest circuit threshold voltage, and the falling waveform circuit threshold voltage Vth-DOWN is a voltage greater than the circuit threshold voltage of the logic cell having the highest circuit threshold voltage. Furthermore, these voltages are determined such that the following equation is satisfied: input waveform level H (e.g., power source voltage VDD)—[falling waveform circuit threshold voltage Vth-DOWN]=[rising waveform circuit threshold voltage Vth-UP]−input waveform level L (e.g., 0 [V])=$\Delta$V.

As a result, a negative delay time is never produced for a logic cell. In addition, the circuit threshold voltage for determining the delay time never diverges between logic cells.

Therefore, according to the first embodiment of the second invention, since the delay time for an LSI circuit can be calculated to a high degree of accuracy by adding up delay times for each logic cell, whilst taking account of input through-rate and output load capacitance, on the basis of circuit information, LSI circuit delay time can be calculated in a short period of time, and highly accurate LSI circuit logic inspection can be implemented.

Figure 33:
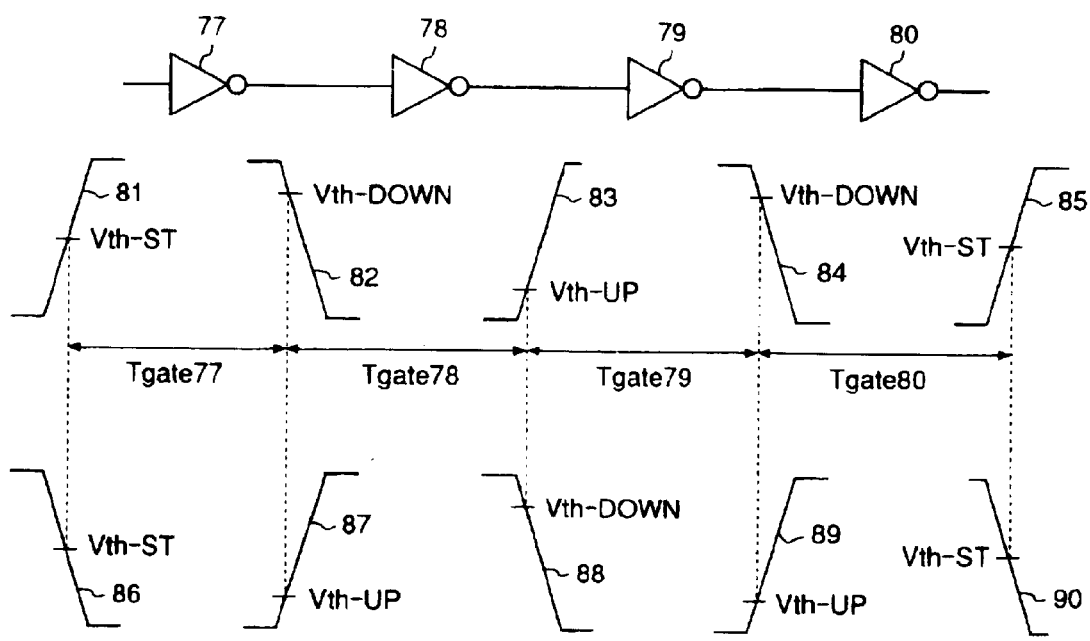
FIG. 33 is a diagram for describing a method of determining a suitable circuit threshold voltage applied to a case where an in-system inspection is conducted.
Figure 34:
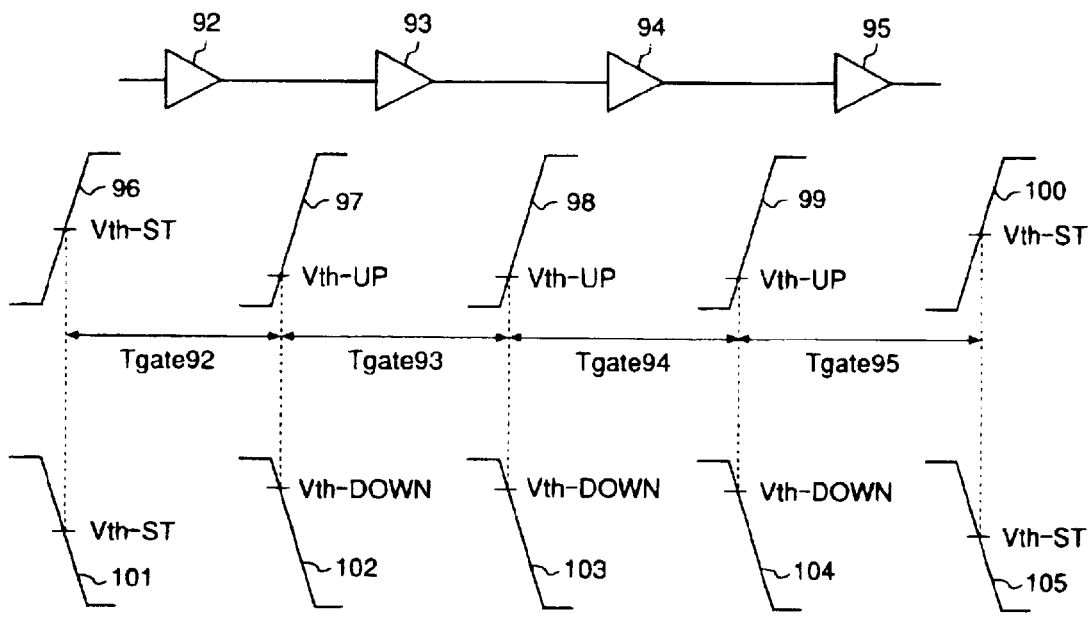
FIG. 34 is a diagram for describing a method of determining a suitable circuit threshold voltage applied to a case where an in-system inspection is conducted.

FIG. 33 and FIG. 34 are diagrams for describing a method of determining suitable circuit threshold voltages, applied to a case of in-system inspection.

In FIG. 33, 77, 78, 79 and 80 are logic cell whose input signal and output signal are of inverse polarity, and 77 is a logic cell forming an input circuit for inputting an external signal, 78 and 79 are internal cells, and 80 is a logic cell forming an output circuit for outputting a signal externally.

81 and 86 are input signals to logic cell 77, 82 and 87 are output signals from logic cell 77 (input signals to logic cell 78), 83 and 88 are output signals from logic cell 78 (input signals to logic cell 79), 84 and 89 are output signals from logic cell 79 (input signals to logic cell 80), and 85 and 90 are output signals from logic cell 80. Tgate77 is the delay time of logic cell 77, Tgate78 is the delay time of logic cell 78, Tgate79 is the delay time of logic cell 79, and Tgate80 is the delay time of logic cell 80.

In FIG. 34, 92, 93, 94 and 95 are logic cells whose input signal and output signal are of the same polarity. 92 is a logic cell forming an input circuit for inputting an external signal, 93 and 94 are internal cells, and 95 is a logic cell forming an output circuit for outputting a signal externally.

96 and 101 are input signals to logic cell 92, 97 and 102 are output signals from logic cell 92 (input signals to logic cell 93), 98 and 103 are output signals from logic cell 93 (input signals to logic cell 94), 99 and 104 are output signals from logic cell 94 (input signals to logic cell 95), and 100 and 105 are output signals from logic cell 95.

Tgate 92 is the delay time of logic cell 92, Tgate 93 is the delay time of logic cell 93, Tgate 94 is the delay time of logic cell 94, and Tgate 95 is the delay time of logic cell 95.

In this way, if the circuit threshold voltage for the logic cells 77, 92 forming the input circuit for inputting external signals and the logic cells 80, 95 forming the output circuits for outputting signals externally is set to a generally used circuit threshold voltage Vth-ST, whilst the rising waveform circuit threshold voltage Vth-UP and the falling waveform circuit threshold voltage Vth-DOWN are used for the circuit threshold voltage of the internal cells 78, 79, 93, 94, it is possible to express the input-output delay time between LSI chips by means of a generally used judgement level.

In such cases, the logic cells 77 and 92 must be set such that their actual circuit threshold voltage approaches the generally used circuit threshold voltage Vth-ST, in order that the delay times Tgate77 and Tgate92 for logic cells 77 and 92 are not given negative values. Second embodiment (FIG. 35–FIG. 38)

Figure 35:
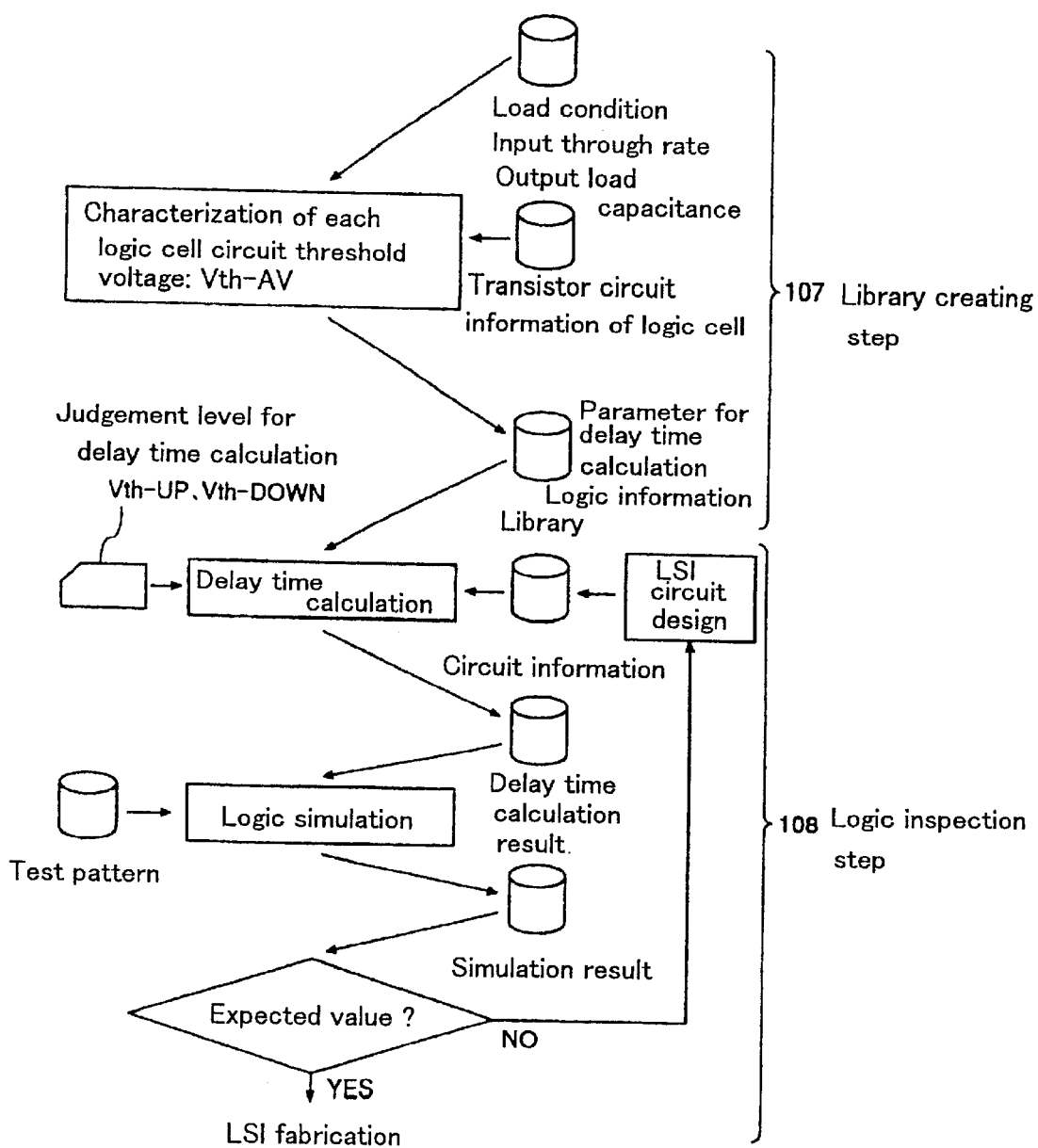
FIG. 35 is a flowchart giving an approximate illustration of a second mode for implementing the present invention.

FIG. 35 is a flow-chart giving an approximate illustration of a second embodiment of the second invention. In FIG. 35, 107 is a library creating step, and 108 is a logic inspection step.

Specifically, in the library creating step 107, the input through-rate and output load capacitance forming the load conditions are taken as variable elements, the circuit threshold voltage for each logic cell is taken as an average circuit threshold voltage Vth-AV, a characterizing step for gathering characteristics for each logic cell is carried out on the basis of the transistor circuit information for the logic cells, and the characteristics of each logic cell gathered in this way are recorded as parameters for calculating LSI circuit delay time (see FIG. 16B) in a file called a library, along with logic information.

Furthermore, in the second embodiment of the second invention, the delay times for the logic cells recorded in the library are as shown in FIG. 36 and FIG. 37.

Figure 36A:
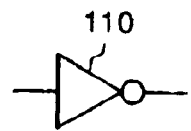
FIGS. 36A–36C show diagrams for describing the definition of logic cell delay times recorded in a library in the second mode for implementing the present invention.
Figure 36B:
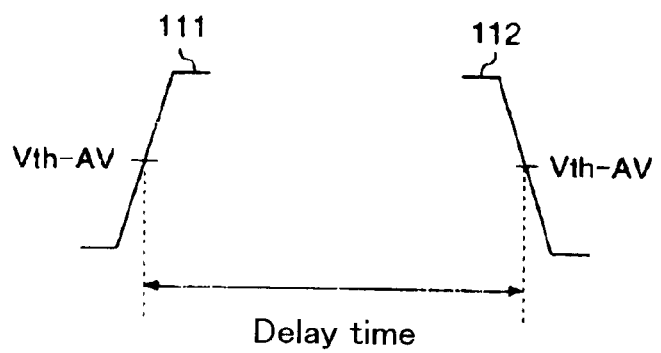

Namely, as shown in FIG. 36A, the input signal and output signal in logic cell 110 are of inverse polarity, and as shown in FIG. 36B, if the input signal 111 is a rising waveform, then the delay time for logic cell 110 will be the time from the point at which the input signal 111 rises to the average circuit threshold voltage Vth-AV until the output signal 112 falls to the average circuit threshold voltage Vth-AV.

Figure 36C:
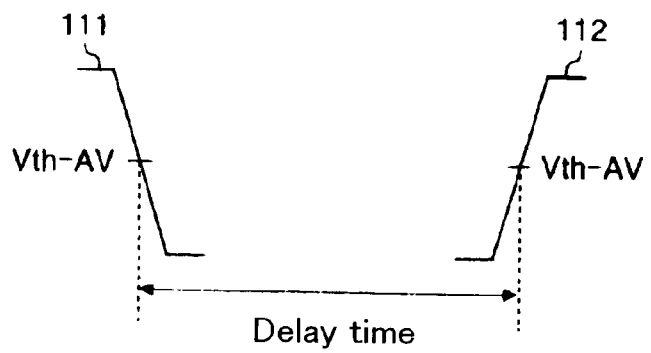

Furthermore, as shown in FIG. 36A, the input signal and output signal in logic cell 110 are of inverse polarity, and as shown in FIG. 36C, if the input signal 111 is a falling waveform, then the delay time for logic cell 110 will be the time from the point at which the input signal 111 falls to the average circuit threshold voltage Vth-AV until the output signal 112 rises to the average circuit threshold voltage Vth-AV.

Figure 37A:
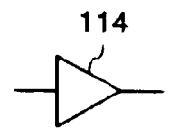
FIGS. 37A–37C show diagrams for describing the definition of logic cell delay times recorded in a library in the second mode for implementing the present invention.
Figure 37B:
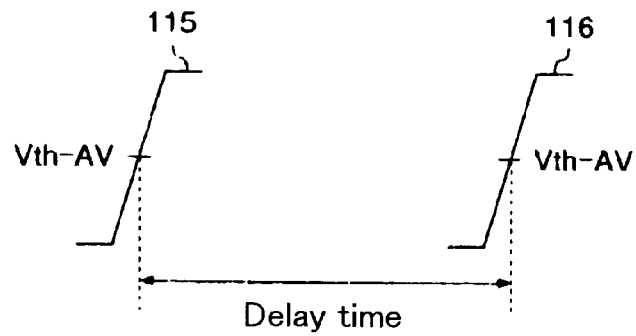

As shown in FIG. 37A, the input signal and output signal in logic cell 114 are of the same polarity, and as shown in FIG. 37B, if the input signal 115 is a rising waveform, the delay time for the logic cell 114 will be the time from the point at which the input signal 115 rises to the average circuit threshold voltage Vth-AV until the output signal 116 rises to the average circuit threshold voltage Vth-AV.

Figure 37C:
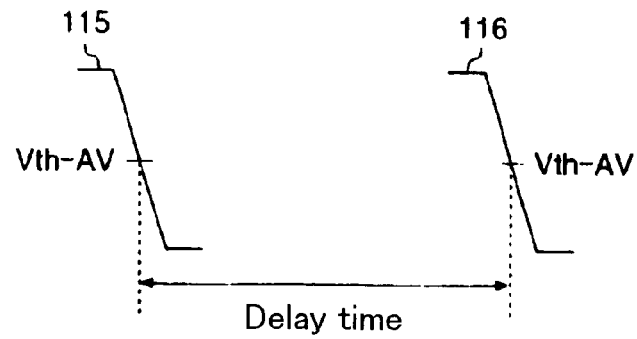

As shown in FIG. 37A, the input signal and output signal in logic cell 114 are of the same polarity, and as shown in FIG. 37C, if the input signal 115 is a falling waveform, the delay time for the logic cell 114 will be the time from the point at which the input signal 115 falls to the average circuit threshold voltage Vth-AV until the output signal 116 falls to the average circuit threshold voltage Vth-AV.

In the LSI circuit logic inspection step 108, delay times for an LSI circuit are calculated by means of a delay time calculating program, which calculates LSI circuit delay times by referring to the library wherein parameters for delay time calculation are recorded.

In the second embodiment of the second invention, when the LSI circuit delay times are calculated by means of a delay time calculating program, the logic cell delay times derived using the average circuit threshold voltage Vth-AV as the judgement level are converted into logic cell delay times which take a rising waveform circuit threshold voltage Vth-UP or a falling waveform circuit threshold voltage Vth-DOWN as the judgement level.

Similarly to the first embodiment of the second invention, the rising waveform circuit threshold voltage Vth-UP is lower than the circuit threshold voltage of the logic cell having the lowest circuit threshold voltage, and the falling waveform circuit threshold voltage Vth-DOWN is higher than the circuit threshold voltage of the logic cell having the highest circuit threshold voltage. Furthermore, these voltages are determined such that the following equation is satisfied: input waveform level H (e.g., power source voltage VDD)–[falling waveform circuit threshold voltage Vth-DOWN]=[rising waveform circuit threshold voltage Vth-UP]–input waveform level L (e.g., 0 [V])=AV.

Figure 38:
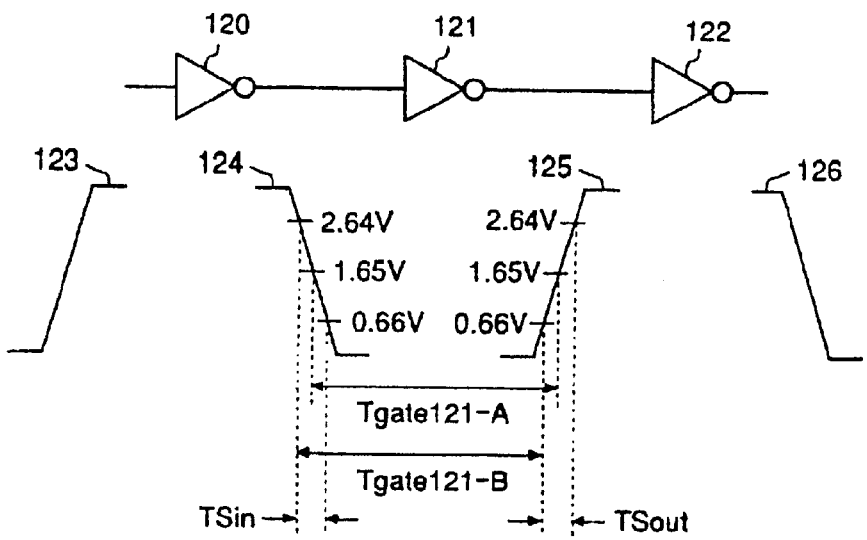
FIG. 38 is a diagram for describing an operation of converting logic cell delay times implemented when the LSI circuit delay time is calculated by means of a delay time calculating program.

FIG. 38 is a diagram for describing the operation of converting logic cell delay times implemented when calculating LSI circuit delay time by means of a delay time calculating program in the second embodiment of the second invention.

In FIG. 38, 120, 121 and 122 are logic cells whose input signals and output signals are of inverse polarity, 123 is the input signal to logic cell 120, 124 is the output signal from logic cell 120 (input signal to logic cell 121), 125 is the output signal from logic cell 121 (input signal to logic cell 122), and 126 is the output signal from logic cell 122.

In the example shown in FIG. 38, the power source voltage VDD=3.3 (V), the average circuit threshold voltage Vth-AV=1.65 (V), the rising waveform circuit threshold voltage Vth-UP=0.66 (V), and the falling waveform circuit threshold voltage Vth-DOWN=2.64 (V).

Here, the delay time conversion implemented in the second embodiment of the second invention will be described with reference to logic cell 121, for an example where the delay time Tgate121-A derived using the average circuit threshold voltage Vth-AV as the judgement level is converted to a delay time Tgate121-B which takes a rising waveform circuit threshold voltage Vth-UP or a falling waveform circuit threshold voltage Vth-DOWN as the judgement level.

The range of the input through-rate is 20–80 (%) of the power source voltage VDD: this voltage differential is 60% of the power source voltage VDD, and the interval between the falling waveform circuit threshold voltage Vth-DOWN (2.64 (V)) and the average circuit threshold voltage Vth-AV (1.65(V)) is 30% of the power source voltage VDD (3.3 (V)).

In other words, since the interval between the falling waveform circuit threshold voltage Vth-DOWN (2.64 (V)) and the average circuit threshold voltage Vth-AV (1.65 (V)) is ½ of the input through-rate (30%:60%), the conversion from the circuit threshold voltage of 1.65 (V) to 2.64 (V) can be carried out by adding half the input through-rate.

Similarly, the range of the output through-rate is 20–80 (%) of the power source voltage VDD: this voltage differential is 60% of the power source voltage VDD, and the interval between the rising waveform circuit threshold voltage Vth-UP (0.66 (V)) and the average circuit threshold voltage Vth-AV (1.65(V)) is 30% of the power source voltage VDD (3.3 (V)).

In other words, since the interval between the rising waveform circuit threshold voltage Vth-UP (0.66 (V)) and the average circuit threshold voltage Vth-AV (1.65 (V)) is ½ of the input through-rate, the conversion from the circuit threshold voltage of 1.65 (V) to 0.66 (V) can be carried out by subtracting half the output through-rate.

Consequently, the conversion with respect to logic cell 121 from delay time Tgate121-A derived using the average circuit threshold voltage Vth-AV as the judgement level to a delay time Tgate121-B taking a rising waveform circuit threshold voltage Vth-UP or falling waveform circuit threshold voltage Vth-DOWN as the judgement level, can be completed using the following equation $$(Tgate121\text{-}B)=(Tgate121\text{-}A)+(½)T\ Sin-(½)TSout.$$

In the second embodiment of the rising waveform circuit threshold voltage Vth-UP is lower than the circuit threshold voltage of the logic cell having the lowest circuit threshold voltage of all the logic cells, and the rising waveform circuit threshold voltage Vth-DOWN is higher than the circuit threshold voltage of the logic cell having the highest circuit threshold voltage of all the logic cells. Furthermore, since the voltages satisfy the following equation, input waveform level H (e.g., power source voltage VDD)–[falling waveform circuit threshold voltage Vth-DOWN]=[rising waveform circuit threshold voltage Vth-UP]–input waveform level L (e.g., 0 [V])=ΔV, a negative delay time is never produced for a logic cell.

Therefore, according to the second embodiment of the second invention, similarly to the first embodiment of the present invention, LSI circuit delay times can be calculated in a short period of time, and highly accurate LSI circuit logic inspection can be conducted.

As described above, according to the second invention, a negative delay time is never produced for a logic cell, and since the delay time for an LSI circuit can be calculated with a high degree of accuracy by adding delay times for each logic cell, whilst taking account of input through-rate and output load capacitance, on the basis of circuit information, without any divergence between logic cells in the circuit threshold voltage used to determine the delay time, LSI circuit delay time can be calculated in a short period of time or by a simple calculation, and highly accurate LSI circuit logic inspection can be implemented.

What is claimed is:

1. A method of conducting logic simulation of an integrated circuit device, wherein a macro containing logic circuits formed therein is included in a chip including a plurality of cells, said method comprising:

characterizing the macro by determining a first delay parameter of an input terminal of an internal cell of the macro connected to the input terminal of said macro, and a second delay parameter of an output terminal of an internal cell of the macro connected to the output terminal of said macro;

determining delay time data for a whole logic circuit including the plurality of cells and the macro, in accordance with: delay parameters determined for said macro, wherein said first delay parameter is taken as an input terminal delay parameter and said second delay parameter is taken as an output terminal delay parameter; delay parameters determined for said plurality of cells; and connection data for said whole logic circuit;

merging said determined delay time data for the whole logic circuit and internal delay time data for said macro, said internal delay time data for said macro being read from a library; and simulating logic for said whole logic circuit in accordance with the merged delay time data.

2. The method according to claim 1, wherein said first delay parameter is a parameter dependent on an input through-rate, and an input delay time of said macro is determined from said input through-rate according to the logic circuit and said first delay parameter.

3. The method according to claim 1, wherein: said second delay parameter is a parameter dependent on an output load capacitance, and an output delay time of said macro is determined from said load capacitance according to the logic circuit and said second delay parameter.

4. The method according to claim 1, wherein said plurality of cells are designed based on first design rules and said macro are designed based on second design rules different from said first design rules.

5. A method of conducting logic simulation of an integrated circuit device, wherein a macro containing logic circuits is formed therein, for which internal delay time data is given, is included in a chip including a plurality of cells, comprising:

characterizing the macro by determining a first delay parameter, which is dependent on an input through-rate and is based upon an input terminal of an input-side internal cell of the macro connected to the input terminal of said macro, and a second delay parameter, which is dependent on an output load capacitance and is based on an output terminal of an output-side internal cell of the macro connected to the output terminal of said macro;

determining delay time data for said whole logic circuit comprising delay time data for the input terminal and output terminal of said macro and delay time data for said plurality of cells, in accordance with: delay parameters determined for said macro, wherein said first delay parameter is taken as said input terminal delay parameter and said second delay parameter is taken as said output terminal delay parameter; delay parameters determined for said plurality of cells; and connection data for said whole logic circuit;

providing the delay time data for the input terminal and output terminal of said macro in the internal delay time data for said macro, respectively, as delay time data for the input terminal of said input-side internal cell of the macro and delay time data for the output terminal of said output-side internal cell of the macro;

merging said determined delay time data for the whole logic circuit and internal delay time data for said macro, said internal delay time data for said macro being read from a library; and conducting a logic simulation for said whole logic circuit in accordance with the merged delay time data.

6. The method according to claim 5, wherein: the internal delay time data for said macro and the delay time data for said whole logic circuit is recorded in accordance with SDF (Standard Delay Format).

7. The method according to claim 5, wherein:

the internal delay time data for said macro is determined by setting the input through-rate to the input terminal of said input-side internal cell of the macro as shortest, and setting the load capacitance at the output terminal of said output-side internal cell of the macro as smallest, and this data is provided with said macro in advance.

8. The method according to claim 5, wherein:

in determining said delay time, said plurality of cells includes at least a third delay parameter dependent on the input through-rate and a fourth delay parameter dependent on the output load capacitance;

the delay times for the input terminals of said cells and macro are determined from the respective input through-rate according to said whole logic circuit, the third delay parameter for said cells, and the input terminal delay parameter for said macro; and the delay times for the output terminals of said cells and macro are determined from the respective load capacitance according to said whole logic circuit, the fourth delay parameter for said cells, and the output terminal delay parameter for said macro.

9. The method according to claim 5, wherein the delay time data given for the macro is corrected with respect to a power source voltage given to said macro in said whole logic circuit.

10. The method according to claim 5, wherein the logic of said macro and said plurality of cells is designed according to different design rules.

* * * * *